US008631308B2

United States Patent
Goessel et al.

(10) Patent No.: US 8,631,308 B2
(45) Date of Patent: Jan. 14, 2014

(54) APPARATUS AND METHOD FOR DETERMINATION OF A POSITION OF A 1 BIT ERROR IN A CODED BIT SEQUENCE, APPARATUS AND METHOD FOR CORRECTION OF A 1-BIT ERROR IN A CODED BIT SEQUENCE AND DECODER AND METHOD FOR DECODING AN INCORRECT, CODED BIT SEQUENCE

(75) Inventors: Michael Goessel, Mahlow (DE); Michael Richter, Munich (DE)

(73) Assignee: Infineon Technologies AG, Neubiberg (DE)

( * ) Notice: Subject to any disclaimer, the term of this patent is extended or adjusted under 35 U.S.C. 154(b) by 123 days.

(21) Appl. No.: 13/248,502

(22) Filed: Sep. 29, 2011

(65) Prior Publication Data

US 2012/0079343 A1 Mar. 29, 2012

(30) Foreign Application Priority Data

Sep. 29, 2010 (DE) .......................... 10 2010 041 680

(51) Int. Cl.
*H03M 13/00* (2006.01)
(52) U.S. Cl.
USPC ............ 714/785; 714/752; 714/755; 714/758
(58) Field of Classification Search
USPC .................................. 714/752, 755, 758, 785
See application file for complete search history.

(56) References Cited

PUBLICATIONS

Wang, Zhen, et al. "Relliable MLC NAND Flash Memories Based on Nonlinear t-Error-Correcting Codes." 2010 IEEE/ IFIP International Conference on Dependable Systems and Networks (DSN). Published in 2010. 10 pages.
Wang, Zhen, et al. "Replacing Linear Hamming Codes by Robust Nonlinear Codes Results in a Reliability Improvement of Memories." IEEE/IFIP International Conference on Dependable Systems Networks. Published in 2009. 10 pages.

*Primary Examiner* — Sam Rizk
(74) *Attorney, Agent, or Firm* — Eschweiler & Associates, LLC

(57) ABSTRACT

An apparatus for determination of a position of a 1-bit error includes an error position determiner of the inner code, an error syndrome determiner of the outer code, a derivative determiner and an overall error position determiner. The error position determiner of the inner code determines at least one possible error position of a bit error in the coded bit sequence on the basis of the inner code. The error syndrome determiner of the outer code determines a value of a non-linear syndrome bit of the outer code on the basis of a non-linear function of bits in the coded bit sequence. Furthermore, the derivative determiner determines a value of a derivative bit for at least one determined, possible error position of the bit error on the basis of derivation of the non-linear function based on the bit at the determined, possible error position in the coded bit sequence.

30 Claims, 11 Drawing Sheets

APPARATUS AND METHOD FOR DETERMINATION OF A POSITION OF A 1 BIT ERROR IN A CODED BIT SEQUENCE, APPARATUS AND METHOD FOR CORRECTION OF A 1-BIT ERROR IN A CODED BIT SEQUENCE AND DECODER AND METHOD FOR DECODING AN INCORRECT, CODED BIT SEQUENCE

REFERENCE TO RELATED APPLICATION

This application claims priority to German application number DE 102010041680.0 filed on Sep. 29, 2010.

FIELD

Exemplary embodiments according to the invention relate to the field of error correction and error identification for digital binary signals and, in particular, to an apparatus and a method for determination of a position of a 1-bit error in a coded bit sequence, to an apparatus and to a method for correction of a 1-bit error in a coded bit sequence, and to a decoder and a method for decoding an incorrect, coded bit sequence.

BACKGROUND

The frequency of errors is increasing because of the high integration level of electronic circuits and of memories. It is therefore increasingly necessary to correct and to identify as incorrect digital signals, for example using error-correcting codes.

This also relates in particular to signals that are written to memory, and read from it again.

In particular, codes are advantageous that have good characteristics for error correction of 1-bit errors, and for identification of 2-bit and 3-bit errors. These correct the relatively frequent 1-bit errors, and the 2-bit and 3-bit errors, that occur less frequently, are identified.

One known 1-bit error-correcting code, in which 2-bit errors and 3-bit errors are in most cases identified reliably or with a high probability, is the Vasil'ev code, which is a non-linear code with a non-linear checking equation.

This is structured such that it consists of an inner code, to which at least one additional check bit is added in order to form the outer code, wherein the additional bit is determined by a non-linear function of the bits of the inner code.

In this case, for example, the inner code has the characteristic that there are pairs of 1-bit errors between which the inner code cannot distinguish. When decoding the inner code, it is then not possible to identify which of the two possible 1-bit errors of a pair such as this is present. The additional bit, which is determined by a non-linear function from the bits of the inner code, can then be used to distinguish between two possible 1-bit errors of a pair such as this.

A further check bit can also be added, as can the parity over the n-bits of the inner code and the additional non-linear syndrome bit.

This parity bit is used for improved error identification and to distinguish between different error types, as is known by way of example for a Hamming code.

However, the correction of 1-bit errors is complex.

For example, a multi-stage method is used for error correction, which first of all carries out a trial-and-error error correction process for one bit position of a possible error pair. A check is then carried out to determine whether the correct bit position of the pair has been corrected. In the event of an incorrect correction, the correction which has been made is reversed. The alternative bit position is then corrected. This method is complex.

SUMMARY

The present invention is directed to an improved concept for determination of a position of a 1-bit error in a coded bit sequence, for correction of a 1-bit error in a coded bit sequence and/or for decoding an incorrect, coded bit sequence, that allows the processing time and/or the hardware complexity to be reduced.

One exemplary embodiment according to the invention provides an apparatus for determination of a position of a 1-bit error in a bit sequence that is coded by means of an inner code and an outer non-linear code, that comprises an error position determiner of the inner code, an error syndrome determiner of the outer code, a derivative determiner and an overall error position determiner. The error position determiner of the inner code is configured to determine at least one possible error position of a bit error in the coded bit sequence on the basis of the inner code. The error syndrome determiner of the outer code is configured to determine a value of a non-linear syndrome bit of the outer code on the basis of a non-linear function of bits in the coded bit sequence. Furthermore, the derivative determiner is configured to determine a value of a derivative bit for at least one determined, possible error position of the bit error, based on derivation of the non-linear function based on the bit at the determined, possible error position in the coded bit sequence. In addition, the overall error position determiner is configured to determine an error position of the bit error on the basis of the non-linear syndrome bit and at least one derivative bit when the error position determiner of the inner code determines more than one possible error position of the bit error. Alternatively, the overall error position determiner is configured to identify the bit error as a 1-bit error on the basis of the non-linear syndrome bit and a derivative bit of a determined, possible error position, and to distinguish this from a multi-bit error, and thus to identify the determined, possible error position as the error position of the 1-bit error when the error position determiner of the inner code determines only one possible error position of the bit error in the coded bit sequence.

Exemplary embodiments according to the invention are based on the fundamental idea of determining the precise error position of a 1-bit error and/or of distinguishing between 1-bit errors and multi-bit errors on the basis of derivation of the non-linear function based on the respective bit in the coded bit sequence. By way of example, the non-linear function can be chosen for this purpose such that the derivation of the non-linear function results in different values for the derivative based on bits of different determined, possible error positions of the same bit error. For example, there is no need therefore for an iterative method to determine the precise error position of a 1-bit error, when a plurality of error positions in the coded bit sequence are possible on the basis of the evaluation of the linear check bits. This makes it possible to considerably reduce the processing time and/or the hardware complexity for determination of the position of a 1-bit error.

In some exemplary embodiments according to the invention, the error position determiner of the inner code determines one and only one possible error position. In this case, the overall error position determiner can distinguish between a 1-bit error and a multi-bit error on the basis of the non-linear syndrome bit and a derivative bit of the determined possible error position. In the case of a 1-bit error, the overall error position determiner can identify the determined possible error position as the error position of the 1-bit error.

In some exemplary embodiments according to the invention, the error position determiner of the inner code determines two possible error positions. In this case, the overall error position determiner can use the non-linear syndrome bit and at least one derivative bit to determine the error position of an identified 1-bit error.

In some exemplary embodiments according to the invention, the coded bit sequence is coded on the basis of a Vasil'ev code.

Some exemplary embodiments relate to an apparatus for correction of a 1-bit error in a coded bit sequence using an apparatus for determination of a position of a 1-bit error and a 1-bit error correction unit, that changes a value of the bit at the determined or identified error position in the coded bit sequence in order to correct the 1-bit error.

Some further exemplary embodiments according to the invention relate to a decoder for decoding an incorrect, coded bit sequence using an apparatus for correction of a 1-bit error and a decoding unit that decodes the corrected, coded bit sequence in order to obtain a decoded bit sequence.

BRIEF DESCRIPTION OF THE DRAWINGS

Exemplary embodiments according to the invention will be explained in more detail in the following text with reference to the attached figures, in which.

DETAILED DESCRIPTION

In some cases, the same reference symbols are used in the following text for objects and functional units that have the same or similar functional characteristics. Furthermore, optional features of the various exemplary embodiments can be combined with one another or replaced by one another.

For example, where the following text refers to a bit (for example syndrome bit, derivative bit, . . . ), the use of a bit for calculation or a bit as a result of a calculation, then this may mean not only the bit itself but also the value of the bit (logic 0 or logic 1), or a binary signal that represents the value of the bit.

Figure 1A:
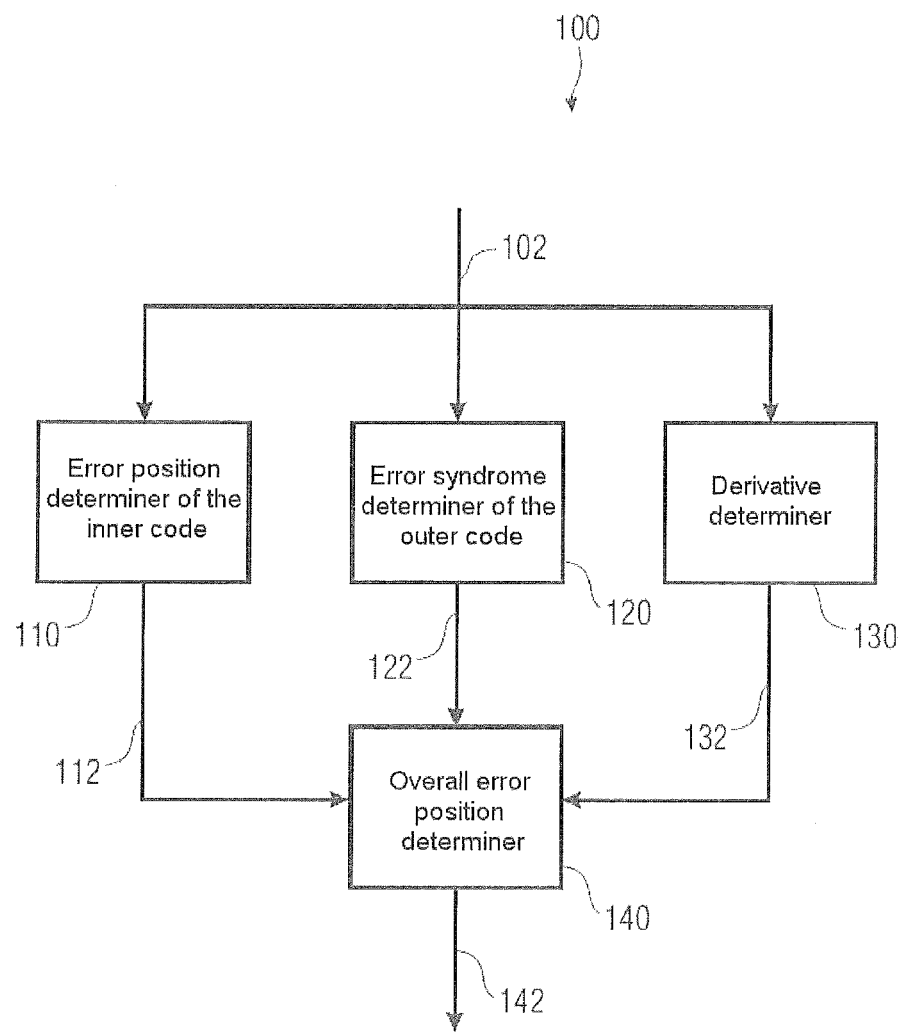
FIGS. 1a and 1b show a block diagram of an apparatus for determination of a position of a 1-bit error in a coded bit sequence.

FIG. 1a shows a block diagram of an apparatus 100 for determination of a position of a 1-bit error in a bit sequence that is coded by means of an inner code and an outer non-linear code, according to one exemplary embodiment of the invention. The apparatus 100 comprises an error position determiner of the inner code 110, an error syndrome determiner of the outer code 120, a derivative determiner 130 and an overall error position determiner 140. The error position determiner of the inner code 110, the error syndrome determiner of the outer code 120 and the derivative determiner 130 are connected to the overall error position determiner 140. The error position determiner of the inner code 110 determines at least one possible error position 112 of a bit error in the coded bit sequence 102 on the basis of the inner code. The error syndrome determiner of the outer code 120 determines a value of a non-linear syndrome bit 122 of the outer code on the basis of a non-linear function of bits in the coded bit sequence 102. Furthermore, the derivative determiner 130 determines a value of a derivative bit 132 for at least one determined, possible error position 112 of the bit error, on the basis of derivation of the non-linear function based on the bit at the determined, possible error position 112 in the coded bit sequence 102. Furthermore, the overall error position determiner 140 determines an error position 142 of the bit error on the basis of the non-linear syndrome bit 122 and at least one derivative bit 132 when the error position determiner of the inner code 110 determines more than one possible error position 112 of the bit error in the bit sequence 112. Alternatively, the overall error position determiner 140 identifies the bit error as a 1-bit error on the basis of the non-linear syndrome bit 122 and a derivative bit 132 of a determined, possible error position 112, and thus identifies the determined, possible error position 112 as the error position 142 of the 1-bit error, when the error position determiner of the inner code 110 determines only one possible error position 112 of the bit error in the coded bit sequence 102.

The precise error position 142 of a 1-bit error and/or the distinction between 1-bit errors and multi-bit errors can be determined using the derivative of the non-linear function based on the respective bit in the coded bit sequence. By way of example, this makes it possible to avoid an iterative approach, thus considerably reducing the processing time and/or the hardware complexity for determination of the position of a 1-bit error. In this context, distinguishing between 1-bit errors and multi-bit errors means that at least some multi-bit errors (for example even multi-bit errors) can be distinguished from a 1-bit error. However, it need not be possible to distinguish all multi-bit errors from a 1-bit error. It likewise need not be possible to distinguish between all identifiable multi-bit errors for each bit sequence and a 1-bit error.

By way of example, the coded bit sequence 102 can be made available by a memory unit or a transmitter. By way of example, the coded bit sequence can be coded using the inner code of a Vasil'ev code. The inner code may, for example, be a linear Hamming code, a Hsiao code, an even-odd code or, once again, a non-linear Vasil'ev code. In addition, the coded bit sequence may contain a non-linear comparison check bit, or a non-linear comparison check bit may be provided in addition to the coded bit sequence 102 of the apparatus 100. The non-linear comparison check bit will in this case have been calculated, for example, before the storage or transmission of the coded bit sequence. The bit sequence can also be referred to as a binary word. Different coded bit sequences (which, for example, are read successively from a memory unit) may, for example, always have the same number of bits. In other words, the word length of the binary words processed by the apparatus 100 may always be the same.

By way of example, the non-linear function is a Boolean function. Boolean functions may be subdivided into linear and non-linear functions, as is described for example in "S. W. Jablonski, G. P. Gawrilow, W. B. Kudrjawzew, "Boolesche Funktionen and Postsche Klassen" [Boolean functions and post classes], Academy Press, Berlin, 1969, page 18". A Boolean function is linear when it can be represented as $$f(x_1, x_2, \ldots, x_n) = c_0 \oplus c_1 x_1 \oplus c_2 x_2 \oplus \ldots \oplus c_n x_n$$

where $\oplus$ denotes the non-equivalence and $c_i \in \{0,1\}$. All other functions are non-linear.

General examples of non-linear functions are:

$$f(x_1, x_2, \ldots, x_5) = x_1 x_2 \oplus x_3 x_4 \oplus x_5$$

$$f(x_1, x_2, \ldots, x_5) = x_1 x_3 \oplus x_4 x_5 \oplus x_1 x_2 x_4$$

The non-linear function may vary within wide ranges. For example, a non-linear function can be chosen in which each bit in the coded bit sequence 102, that the error position determiner of the inner code 110 determines as a possible error position 112 together with at least one further possible error position 112 of a bit error, is contained at least once in a non-linear term of the non-linear function. In other words, at least one pair of bits that cannot be distinguished from one another in the event of a bit error on the basis of the check bits of the inner code are contained in a non-linear term in the non-linear function.

Additionally or alternatively, the non-linear function may, for example, be chosen such that derivation of the non-linear function results in a different derived function for two determined, possible error functions 112, based on the respective bit of the two determined, possible error positions 112. In this context, the derivative determiner 130 can calculate the value of a derivative bit based on the associated derived function. It is then possible for the overall error position determiner 140 to use the different values of the derivative bits 132 to decide which determined, possible error position 112 is the actual error position 142 of a 1-bit error.

The probability of being able to distinguish between 1-bit errors and multi-bit errors can be increased by the choice of the non-linear function. Specifically, when a permanent error is present in one bit (for example stuck at 0 or stuck at 1), the probability of detecting the error can be considerably increased over a number of clock cycles of the apparatus (based on a plurality of processed coded bit sequences).

Figure 1B:
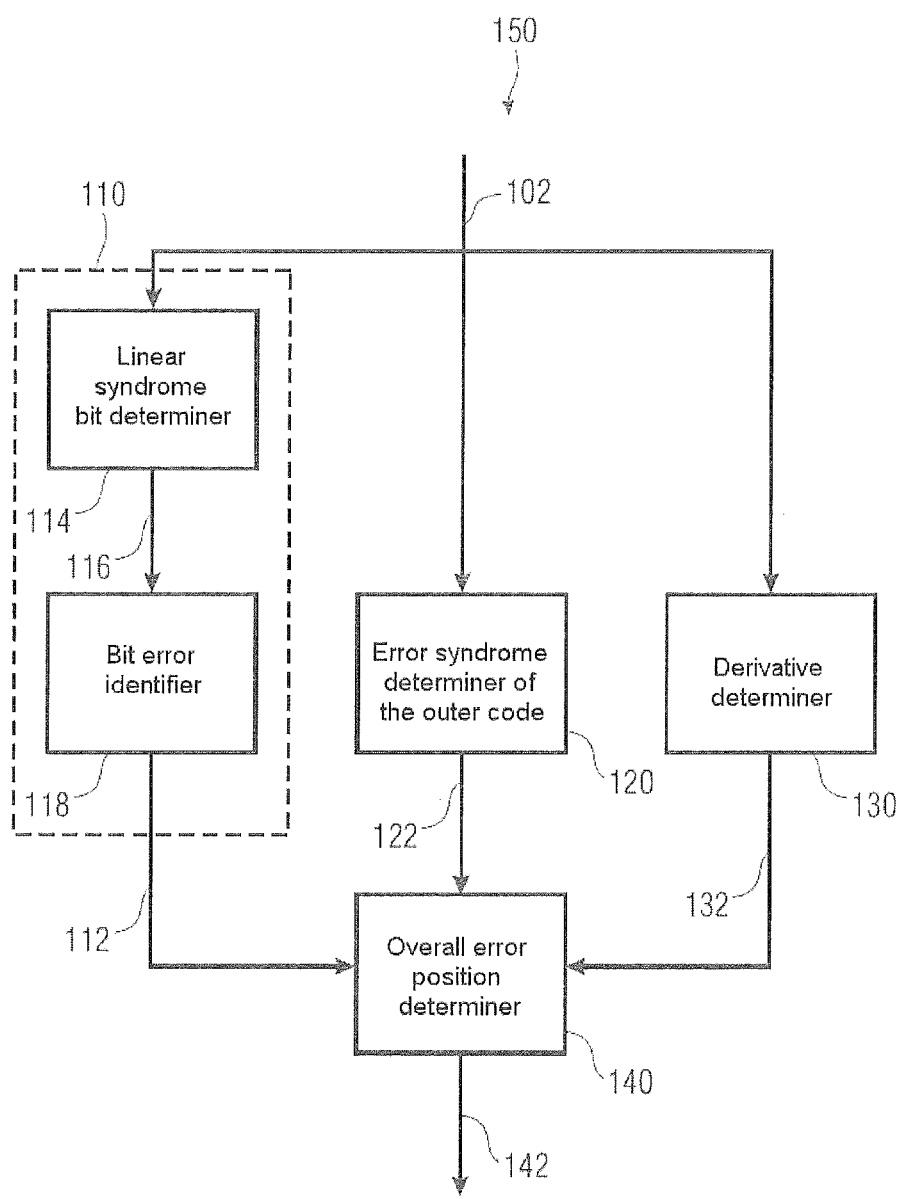

As already mentioned, the inner code may be chosen differently. For example, a linear inner code can be used. Although a number of exemplary embodiments in the following text refer to the use of a linear inner code, the described aspects can also be applied in a general form to a multiplicity of different inner codes. FIG. 1b shows a block diagram of an apparatus 150 for determination of a position of a 1-bit error in a coded bit sequence 102 corresponding to one exemplary embodiment according to the invention. The design of the apparatus 150 is similar to the design of the apparatus shown in FIG. 1a, but the error position determiner of the inner code 110 comprises a linear syndrome bit determiner 114 and a bit error identifier 118. The linear syndrome bit determiner 114 is connected to the bit error identifier 118, and the bit error identifier 118 is connected to the overall error position determiner 140.

In this example, the linear syndrome bit determiner 114 determines values of a plurality of linear syndrome bits 116 on the basis of a plurality of linear functions of bits in the coded bit sequence 102. Furthermore, the bit error identifier 118 determines at least one possible error position 112 of a bit error in the coded bit sequence 102 on the basis of the plurality of linear syndrome bits 116.

A distinction can be drawn between a 1-bit error and a multi-bit error and/or the error position of a 1-bit error can be identified by taking account of the derivation of the non-linear function when a plurality of possible error positions are identified on the basis of the linear check bits or it is unclear whether the bit error is a 1-bit error. In other words, when more than one possible error position is identified, for example with the aid of the linear check bits and non-linear syndrome bits, this ambiguous result can be resolved by derivation of the non-linear function based on the respective bit at the determined, possible error position. By way of example, the use of the derivation of the non-linear function makes it possible to avoid an iterative method for identification of the error position of the bit error, thus making it possible to considerably reduce the computation time and/or the computation complexity.

The plurality of linear functions and the non-linear function can be predetermined for the coding of the coded bit sequence 102 (for example the plurality of linear functions by the inner code of a Vasil'ev code and the non-linear function for calculation of the non-linear syndrome bit in the Vasil'ev code), as a result of which the error position determiner of the inner code 110 can determine at least one possible error position of a bit error in the coded bit sequence 102 on the basis of the plurality of linear check bits 102, and the overall error position determiner 140 can determine an error position of the 1-bit error on the basis of derivative bits, or can identify the bit error as a 1-bit error on the basis of a derivative bit. The linear function and the non-linear function may each depend on different bits in the coded bit sequence 102. A linear function and/or the non-linear function may depend on a plurality of bits in the coded function or else on all the bits in the non-linear function.

The error position determiner of inner code 110 determines, for example, possible error positions 112 of a bit error on the basis of the plurality of linear syndrome bits 116. In this case, for example, a deliberate choice of the linear functions (for example based on a linear Hamming code) can be used to make it possible for the error position determiner of the inner code to identify all the possible error positions of a bit error. In other words, if the error position determiner of the inner code 110 identifies that a bit error is present, the error position determiner of the inner code 110 can determine all the possible error positions 112 of a bit error on the basis of the plurality of linear syndrome bits 116. The number of possible error positions 112 of a bit error may in this case be dependent inter alia on the number of the linear check bits, the linear functions on which they are based, and the type of coding of the coded bit sequence 102.

If the bit error is a multi-bit error, it is possible for a possible error position to be incorrectly identified as the error position 142 of the bit error. Therefore, in addition to identification of the position of the bit error, it is therefore also important to distinguish between 1-bit errors and multi-bit errors. For example, if the error position determiner of the inner code 110 determines only one possible error position 112, then the overall error position determiner 140 can investigate whether the bit error is a 1-bit error or a multi-bit error. If the overall error position determiner 140 identifies the bit error as a 1-bit error (on the basis of the non-linear syndrome bit 122 and a derivative bit 132 of the determined possible error position), then the determined, possible error position 112 can also automatically be identified as the error position 142 of the 1-bit error, since there are no further possible error positions 112 for selection.

Alternatively, the error position determiner of the inner code 110 identifies two possible error positions 112 of a bit error. In this case, the overall error position determiner 140 can identify the bit error as a 1-bit error on the basis of the non-linear syndrome bit 122, and can determine the error position of the 1-bit error on the basis of the non-linear syndrome bit and the two derivative bits of the determined, possible error positions 112.

In order to make it possible to distinguish between more than two possible error positions, it is possible to use more than one non-linear syndrome bit on the basis of different non-linear functions. In general, the error syndrome determiner of the outer code 120 may, for example, determine a predefined number p of non-linear syndrome bits on the basis of a corresponding number of non-linear functions. In this example, the error position determiner of the inner code 110 can determine up to 2 raised to the power of the predefined number p of non-linear syndrome bits ($2^p$) of different possible error positions, of which the overall error position determiner 140 can determine the error position of the 1-bit error on the basis of the predefined number of non-linear syndrome bits and the 2 derivative bits 132 raised to the power of the predefined number p of non-linear syndrome bits 122.

As already mentioned, the coded bit sequence 102 may be coded, for example, on the basis of a Vasil'ev code. For example, a linear code (for example a linear Hamming code) can be duplicated, and a non-linear check bit can be added.

In some exemplary embodiments, the coded bit sequence 102 may, for example, comprise a number of bits that is at least equal to 2 raised to the power of a number of linear syndrome bits 116 of the plurality of linear check bits. In this example, the coded bit sequence 102 does not comprise a non-linear comparison check bit. Alternatively, the coded bit sequence 102 may, for example, comprise a number of bits that is at least equal to 2 raised to the power of a number of linear syndrome bits 116 in the plurality of linear check bits +1, when the coded bit sequence 102 comprises a non-linear comparison check bit.

It may be sufficient for the derivative determiner 130 to determine only derivative bits 132 for bits of the coded bit sequence 102 for which the error position determiner of the inner code 110 determines more than one possible error position on the basis of the linear syndrome bits 116 for a 1-bit error. In other words, it may be sufficient for the derivative determiner 130 to determine derivative bits 132 for bits which the error position determiner of the inner code 110 cannot unambiguously identify as the error position of a 1-bit error on the basis of the plurality of linear check bits. Alternatively, the derivative determiner 130 can calculate a value of a derivative bit 132 for each bit in the coded bit sequence 102 on the basis of derivation of the non-linear function based on the respective bit in the coded bit sequence 102. This makes it possible to allow determination of the error position 142 of a 1-bit error that is independent of the bits for which the error position determiner of the inner code 110 can identify an unambiguous error position of a 1-bit error, and with which bits in the coded bit sequence 102 a 1-bit error cannot be unambiguously associated, that is to say more than one possible error position 112.

As already mentioned, the non-linear function is, for example, a Boolean non-linear function. Correspondingly, the derivative determiner 130 can calculate a value of the derivative bit 132 on the basis, for example, of a Boolean derivation of the non-linear function.

The non-linear syndrome bit 122 may correspond to a non-linear bit which can be determined on the basis of the non-linear function and the coded bit sequence. Alternatively or additionally, the coded bit sequence 102 may contain a non-linear comparison check bit, or a non-linear comparison check bit can be provided with the coded bit sequence 102. In this case, the error syndrome determiner of the outer code 120 can use the non-linear comparison check bit that is provided for error position determination. For this purpose, the error syndrome determiner of the outer code 120 may, for example, determine a value of a non-linear check bit on the basis of the non-linear function and the coded bit sequence, and may compare the determined value of the non-linear check bit with a value of a non-linear comparison check bit that is provided in the coded bit sequence 102 (for example by a logic XOR operation), in order to determine the non-linear syndrome bit 122 of the outer code.

By way of example, the plurality of linear functions can be represented or provided by a check matrix or H matrix. Each row (or in a transposed representation, each column) in the check matrix then represents a linear function of the plurality of linear functions. The error position determiner of the inner code 110 may in this example calculate the values of the plurality of linear syndrome bits 116 on the basis of the check matrix. For example, if the coded bit sequence is coded on the basis of a Vasil'ev code, the inner code of the Vasil'ev code (for example a linear Hamming code) may, for example, be represented by the check matrix.

The error position determiner of the inner code 110, the error syndrome determiner of the outer code 120, the derivative determiner 130 and/or the overall error position determiner 140 may, for example, be independent hardware units or part of a computer or microcontroller, as well as computer programs or software products for running on a computer or microcontroller.

The error position determiner of the inner code 110, the error syndrome determiner of the outer code 120, the derivative determiner 130 and the overall error position determiner 140 may be implemented at least partially jointly. For this purpose, by way of example, the described functionality of the error position determiner of the inner code 110, of the error syndrome determiner of the outer code 120, of the derivative determiner (130) and/or of the overall error position determiner (140) may be at least partially combined by means of a synthesis tool to form a combined hardware or software unit.

Some exemplary embodiments according to the invention relate to a hardware implementation of the described concept. By way of example, the error position determiner of the inner code 110 may have a plurality of AND logic gates. In this case, the error position determiner of the inner code can calculate the at least one possible error position 112 on the basis of the plurality of AND logic gates, wherein each AND logic gate from the plurality of AND logic gates has in each case one input for each linear check bit 112 of the plurality of linear check bits.

Independently thereof or additionally, the derivative determiner 130 can calculate the values of derivative bits 132 of two bits in the coded bit sequence 102, which were determined by the error position determiner of the inner code 110 to be possible error positions 112 of the same bit error, on the basis of a logic XOR operation on the two bits in the coded bit sequence 102. The value of the derivative bit of one of the two bits in this case corresponds to a result of the logic XOR operation, and the value of the derivative bit of the other of the two bits corresponds to a negated result of the logic XOR operation.

Furthermore, independently thereof or in combination, the error position determiner of the inner code 110 can calculate a value of a parity bit on the basis of the bits in the coded bit sequence 102, and can distinguish between a 1-bit error and an even multi-bit error on the basis of the parity bit. In other words, the parity bit can be used in addition to the non-linear syndrome bit and/or a derivative bit to make it possible to distinguish with a higher probability between a 1-bit error and multi-bit errors.

Once again independently thereof or in addition thereto, the overall error position determiner 140 can output an error signal for each bit in the coded bit sequence 102. The error signal of a bit in the coded bit sequence 102 in this case indicates whether there is a 1-bit error in the bit in the coded bit sequence 102. The error signal can accordingly be used, for example, to decide whether a bit in the coded bit sequence 102 should be corrected.

In addition, the error position determiner of the inner code 110 can produce the at least one possible error position 112 in the form of a plurality of values of coded output bits. The overall error position determiner 140 can then calculate an error signal of a bit in the coded bit sequence 102 on the basis of a logic XOR operation on the derivative bit 132 of the bit in the coded bit sequence 102 with a difference between the non-linear syndrome bit 122 and a non-linear comparison check bit that is produced in the coded bit sequence 102, and a logic AND operation on the result of the logic XOR operation and at least one of the coded output bits of the error position determiner of the inner code 110.

In general, a logic AND operation can be implemented by an AND logic gate, and the logic XOR operation can be implemented by an XOR logic gate. A negated bit can be obtained by a negater or inverter.

Figure 6:
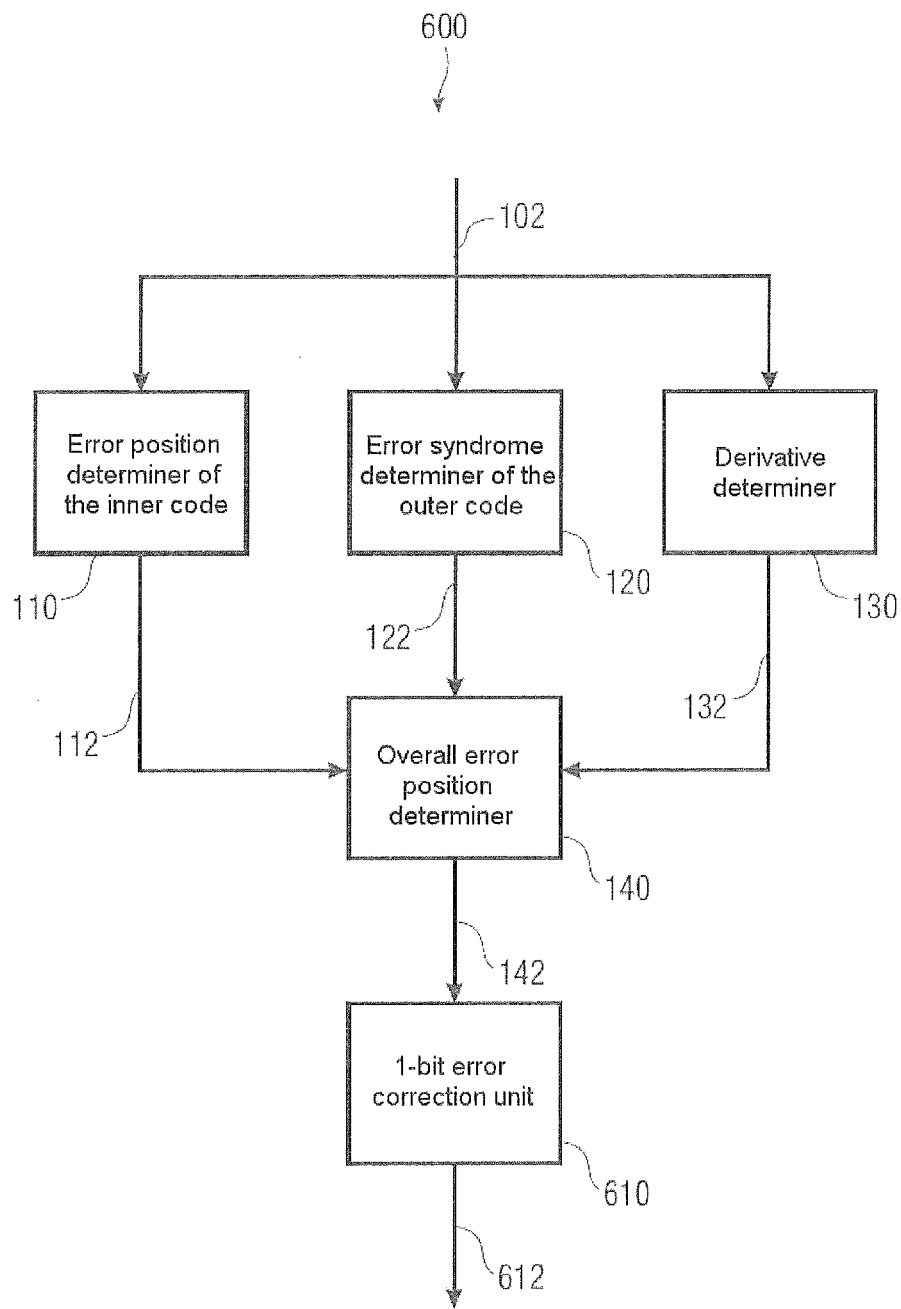
FIG. 6 shows a block diagram of an apparatus for correction of a 1-bit error in a coded bit sequence.

Some exemplary embodiments relate to an apparatus for correction of a 1-bit error in a coded bit sequence. FIG. 6 shows a block diagram of an apparatus 600 such as this for correction of a 1-bit error in a coded bit sequence 102 corresponding to one exemplary embodiment according to the invention. The apparatus 600 is similar to the apparatus shown in FIG. 1a, but additionally has a 1-bit error correction unit 610. In this case, the overall error position determiner 140 is connected to the 1-bit error correction unit 610. The 1-bit error correction unit 610 changes a value of the bit at the determined or identified error position 142 in the coded bit sequence 102, in order to correct the 1-bit error and to obtain a corrected, coded bit sequence 612. The error position determiner of the inner code 110, the error syndrome determiner of the outer code 120, the error position determiner of the inner code 110, the derivative determiner 130 and the overall error position determiner 140 can be implemented in accordance with the concept as described above, also including one or more described optional embodiments or aspects.

In one possible implementation, the 1-bit error correction unit 610 can correct the 1-bit error on the basis of a logic XOR operation on the error signal (produced by the overall error position determiner 140, as described above) of each bit in the coded bit sequence 102 with the respective bit in the coded bit sequence 102.

One specific example for an implementation of an apparatus for correction of a 1-bit error in a coded bit sequence will be described, with one possible hardware implementation, in the following text. However, the described details can also be used independently of one another, both for an apparatus for determination of a position of a 1-bit error in a coded bit sequence and for an apparatus for correction of a 1-bit error in a coded bit sequence, as has been described in a general form above, particularly in conjunction with FIGS. 1a, 1b and FIG. 6.

One aspect of the proposed concept is to reduce the complexity for 1-bit error correction for non-linear codes by using at least one non-linear checking equation.

By way of example, the described concept makes it possible to avoid a multi-stage method for error correction and also to correct the 1-bit error, which cannot be distinguished by the inner code, in one step.

An inner code in C of length n=11 (number of bits in the coded bit sequence) will be considered as one specific example, with this being a linear code. The eleven bits in the code (the coded bit sequence) are identified by $u_1, \ldots, u_4, \ldots, w_1, \ldots, w_7$.

This inner code is characterized in this example by the H matrix $H=(h_1, \ldots, h_{11})$ where:

$$H = \begin{pmatrix} 1 & 1 & 0 & 0 & 1 & 1 & 0 & 1 & 1 & 0 & 0 \\ 1 & 0 & 1 & 0 & 1 & 0 & 1 & 1 & 0 & 1 & 0 \\ 0 & 1 & 0 & 1 & 0 & 1 & 1 & 1 & 0 & 0 & 1 \\ 1 & 2 & 3 & 4 & 5 & 6 & 7 & 8 & 9 & 10 & 11 \\ u_1 & u_2 & u_3 & u_4 & w_1 & w_2 & w_3 & w_4 & w_5 & w_6 & w_7 \end{pmatrix} \quad (1)$$

The column numbers 1, . . . ,11 have been added in the fourth row of this matrix, and the corresponding designations of the associated variables have been added in the fifth row. The fourth and fifth rows in this example serve only to provide a better illustration, but are not actually part of the H matrix, since they do not represent a linear function for determination of a linear check bit.

Since the inner code is a linear code, a code word $$v=v_1, \ldots, v_{11}=u_1,u_2,u_3,u_4,w_1,w_2,w_3,w_4,w_5,w_6,w_7$$

is the code word of the inner code precisely when $$a. s=H \cdot v^T=0 \quad (2)$$

or when $$2. s_1=u_1+u_2+w_1+w_2+w_4+w_5=0 \quad (3)$$

$$3. s_2=u_1+u_3+w_1+w_3+w_4+w_6=0 \quad (4)$$

$$4. s_3=u_2+u_4+w_2+w_3+w_4+w_7=0 \quad (5)$$

In this case, $v^T$ is the transposed column vector of the row vector v, and $s=s_1,s_2,s_3$ is the error syndrome of the linear inner code C under consideration. In this case, $s_1,s_2,s_3$ are linear check bits, and the equations 3-4 represent a plurality of linear functions of bits in the coded bit sequence for calculation of the linear check bits.

If a 1-bit error now occurs in the i-th bit, which can be described by the position [i] or an error vector e[i] where $$a. \ e[i] = (0, \ldots, 0, \underbrace{1}_{i}, 0, \ldots, 0)$$

then the error syndrome $$b. \ s[i]=H \cdot e[i]^T=h_i \quad (6)$$

is associated with this 1-bit error, and is the same as the i-th column $h_1$ in the matrix H.

Since the first and the fifth columns, the second and the sixth columns, the third and the tenth columns and the fourth and the eleventh columns in the H matrix H of equation (1) are in each case the same, it is not possible to use the inner code to distinguish whether a 1-bit error has occurred in the first or fifth bit, in the second or sixth bit, in the third or tenth bit, in the fourth or eleventh bit, while the inner code allows a 1-bit error to be identified unambiguously, and to be corrected, in the seventh, eighth or ninth bit.

The options that result for correction of 1-bit errors by means of the inner code can be described, for example, by a decoding function in D, whose output value is determined by the bits of the inner code.

If no error is present, then the output value of the decoding function D is the same as a coding Cod(0) of the value 0. If a 1-bit error [i] is present, which cannot be distinguished from another 1-bit error [$j_i$] on the basis of the inner code, then the output value of the decoding function is the same as a coding of the pair of the possible 1-bit errors Cod($i,j_i$). If a 1-bit error [r] is present, which can be distinguished from all other 1-bit errors on the basis of the inner code, then the output value of the decoding function is the same, Cod(r).

The decoding function for the inner code, which is described by the H matrix according to equation (1), is, for example:

$$D(u_1, \ldots, u_4, w_1, \ldots, w_7) = D^*(u_1+u_2+w_1+w_2+w_4+w_5, u_1+u_3+w_1+w_3+w_4+w_6, u_2+u_4+w_2+w_3+w_4+w_7)$$

where
 D*(0, 0, 0)=Cod(0),
 D*(1, 0, 0)=Cod(9),
 D*(0, 1, 0)=Cod(3,10),
 D*(0, 0, 1)=Cod(4,11),
 D*(1, 1, 0)=Cod(1, 5),
 D*(1, 0, 1)=Cod(2, 6),
 D*(0, 1, 1)=Cod(7),
 D*(1, 1, 1)=Cod(8).

For all errors in the bits $u_1, u_2, u_3, u_4$, that is to say specifically in the error positions 1, 2, 3, 4, there is one and only error in the bits $w_1, w_2, w_6, w_7$, that is to say in the error positions 4+1=5, 4+2=6, 4+6=10, 4+7=11, which cannot be distinguished by evaluation of the inner code. The output values of the decoding function are correspondingly Cod(1,5), Cod(2, 6), Cod(3,10), Cod(4,11). The bits $u_1, \ldots, u_k$ where k=4 are arranged left-justified, without any restriction to generality. The bits $u_1, u_2, \ldots, u_4$ where k=4 are combined to form the set U={$u_1, u_2, u_3, u_4$}. In general, the set $U \cup TM_W$ is that set of bits for which a 1-bit error in these bits can be distinguished by the inner code from another 1-bit error. The bits $w_1, w_2, w_6, w_7$, whose 1-bit errors cannot be distinguished from the 1-bit errors in the bits $u_i \in U$, form a subset $TM_w$ comprising k=4 elements in the set W={$w_1, \ldots, w_t$}. In the example under consideration:

$TM_W$={$w_1, w_2, w_6, w_7$} and W={$w_1, w_2, w_3, w_4, w_5, w_6, w_7$}.

For $u_i \in U$ where i=1,2,3,4, there is then one $w_{ji} \in TM_w$, specifically the bits $w_1, w_2, w_6, w_7$, as a result of which:

$$D(\overline{u}_1, u_2, u_3, u_4, w_1, w_2, w_3, w_4, w_5, w_6, w_7) = D(u_1, u_2, u_3, u_4, \overline{w}_1, w_2, w_3, w_4, w_5, w_6, w_7),$$

$$D(u_1, \overline{u}_2, u_3, u_4, w_1, w_2, w_3, w_4, w_5, w_6, w_7) = D(u_1, u_2, u_3, u_4, w_1, \overline{w}_2, w_3, w_4, w_5, w_6, w_7),$$

$$D(u_1, u_2, \overline{u}_3, u_4, w_1, w_2, w_3, w_4, w_5, w_6, w_7) = D(u_1, u_2, u_3, u_4, w_1, w_2, w_3, w_4, w_5, \overline{w}_6, w_7),$$

$$D(u_1, u_2, u_3, \overline{u}_4, w_1, w_2, w_3, w_4, w_5, w_6, w_7) = D(u_1, u_2, u_3, u_4, w_1, w_2, w_3, w_4, w_5, w_6, \overline{w}_7),$$

In the exemplary embodiment, it is not possible to distinguish between an error in $u_i$ and an error in $w_{ji}$ using the values determined by the decoding function $D(u_1, \ldots, u_4, w_1, \ldots, w_7)$, with corruption occurring to $\overline{u}_i$ in the case of an error $u_i$, and to $\overline{w}_{ji}$ in the case of $w_{ji}$.

In contrast to this, an error in the bits $w_3, w_4$ and $w_5$ is unambiguously identified from the output values Cod(7), Cod (8), Cod(9) of the decoding function.

A further bit $$\epsilon = \phi(u_1, \ldots, u_4, w_1, \ldots, w_7)$$

is now used, in which case the function $$\phi(u_1, \ldots, u_4, w_1, \ldots, w_7) = u_1+u_2+u_3+u_4+\lambda(u_1+w_1, u_2+w_2, u_3+w_6, u_4+w_7, w_3, w_4, w_5)$$

is now chosen as the function φ here. In this case, λ is an undefined non-linear function.

Using the term of the derivative $$\frac{\delta f(x)}{\delta x} = f(\overline{x}) + f(x)$$

of a Boolean function f(x), then $$\frac{\delta \varphi}{\delta u_1} = \varphi(\overline{u}_1, u_2, u_3, u_4, w_1, \ldots, w_7) + \varphi(u_1, u_2, u_3, u_4, w_1, \ldots, w_7)$$
$$= 1 + \lambda(u_1+w_1+1, u_2+w_2, u_3+w_6, u_4+w_7, w_3, w_4, w_5) + \lambda(u_1+w_1, u_2+w_2, u_3+w_6, u_4+w_7, w_3, w_4, w_5)$$

and $$\frac{\delta \varphi}{\delta w_1} = \varphi(u_1, u_2, u_3, u_4, \overline{w}_1, \ldots, w_7) + \varphi(u_1, u_2, u_3, u_4, w_1, \ldots, w_7)$$
$$= \lambda(u_1+w_1+1, w_2, u_3+w_6, u_4+w_7, w_3, w_4, w_5) + \lambda(u_1+w_1, u_2+w_2, u_3+w_6, u_4+w_7, w_3, w_4, w_5)$$

and therefore $$\frac{\delta \varphi}{\delta u_1} \neq \frac{\delta \varphi}{\delta w_1}.$$

Completely analogously, it can be shown that:

$$\frac{\delta \varphi}{\delta u_2} \neq \frac{\delta \varphi}{\delta w_2},$$
$$\frac{\delta \varphi}{\delta u_3} \neq \frac{\delta \varphi}{\delta w_6},$$
$$\frac{\delta \varphi}{\delta u_4} \neq \frac{\delta \varphi}{\delta w_7}.$$

In this case, $$\frac{\delta \varphi}{\delta u_i} \text{ and } \frac{\delta \varphi}{\delta w_j}$$

for i=1,2,3,4 and for j=1,2,6,7 are the partial derivatives of the Boolean function φ, as described for example in "Zander, H., J., Logischer Entwurf binärer Systeme" [Logic design of binary systems], Verlag Technik, Berlin 1989, 3rd Edition, pages 40-41". The operation "+" in this case represents modulo-2 addition. The output of the decoding function D and the change in the additional bit ε (the non-linear comparison check bit which is produced) and the corresponding derivatives of the non-linear function φ mean that it is now possible to decide which bit of the bits $u_1, \ldots, u_k, w_1, \ldots, w_t$ where k=4 and t=7 here is incorrect in the event of a 1-bit error, and must be corrected. A 1-bit error in the bit ε can be identified unambiguously and can be corrected, since Δε=1 in this case, and the associator (the bit error identifier) outputs the value Cod(0).

Figure 2:
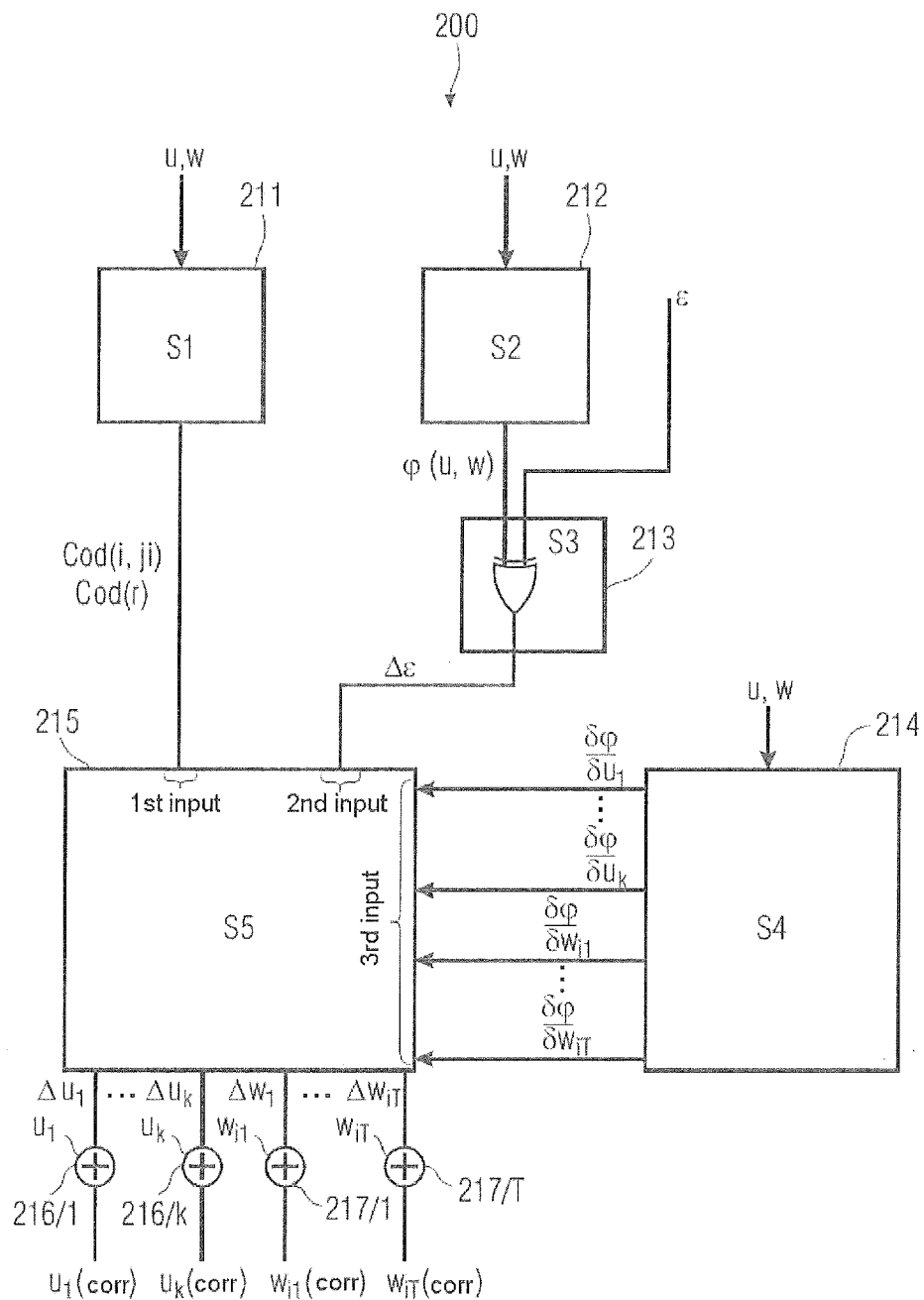
FIG. 2 shows a block diagram of an apparatus for correction of a 1-bit error in a coded bit sequence.

FIG. 2 shows one example of a circuit arrangement 200 according to the invention for error correction of 1-bit errors. The circuit arrangement is composed of the combinational partial circuits S1 211 (linear syndrome bit determiner and error position determiner of the inner code), S2 212 (non-linear check bit determiner of the outer code), S3 213 (subtractor), S4 214 (derivative determiner) and S5 215 (overall error position determiner). The non-linear check bit determiner of the outer code and the subtractor are one example of an implementation of the error syndrome determiner of the outer code. The subtractor S3 213 can also be part of the overall error position determiner, as described in a general form above.

In FIG. 2, the values u, w and ε form the coded bit sequence. In this case, u and w form the values of the inner code, and ε forms a non-linear bit in the outer code.

The values u, w and ε may, for example, have been read from a memory.

The values u and w are present at the same time as k+t binary inputs of a combinational first partial circuit S1 211 (error position determiner of the inner code) in order to determine possible error positions.

The second combinational partial circuit S2 212 and the third combinational partial circuit S3 213 form the error syndrome determiner of the outer code. The partial circuit S2 212 is used to implement the non-linear function φ(u,w), where φ(u,w) represents the non-linear check bit of the outer code derived from u and w. The partial circuit S3 213 is implemented by an XOR gate. This forms the difference Δε between the non-linear check bit ε, which for example is read from a memory, and the non-linear check bits φ(u,w), which are derived from the bits u and w of the inner code. This difference forms the non-linear error syndrome of the outer code.

The values u and w are also present at the inputs of a third combinational partial circuit for the derivative formation S4 214 (derivative determiner). The partial circuit S1 211 implements the decoding function D(u,w), for example, such that the value Cod($i,j_i$) is output at its output when a 1-bit error is present in a bit $u_i \in U=\{u_1,\ldots,u_k\}$ or in a bit $w_{ji} \in TM_w$, that is to say a coding of the two possible error positions i and k+$j_i$ is output. If a 1-bit error is present in $w_r \in \{w_1,\ldots,w_t\}\backslash TM_w$, then the circuit S1 211 outputs the value Cod(r), that is to say a coding of the bit position k+r. If no error has been identified, S1 outputs the value Cod(0). The partial circuit S2 212 implements the Boolean function φ(u,w) from the values u and w. The 1-bit output of the circuit S2 212 is passed to a first input of the combinational partial circuit S3 213, at whose second output the present value of the additional non-linear bit ε (the non-linear comparison check bit that is produced) is present, and which implements an XOR link between its two inputs at its output. The circuit S3 213 outputs at its output the value $$\Delta\varepsilon = \varepsilon + \phi(u,w)$$

that is to say the value of the error syndrome.

The combinational partial circuit for derivative formation S4 14 implements the following Boolean derivatives at its k+T outputs:

$$\frac{\delta\varphi}{\delta u_1},\ldots,\frac{\delta\varphi}{\delta u_k},\frac{\delta\varphi}{\delta w_{i1}},\ldots,\frac{\delta\varphi}{\delta w_{iT}}.$$

The circuit S5 (overall error position determiner) for forming the correction values has a first, a second and a third input.

The k+T binary outputs of the circuit S4 214 are connected to the third k+T bit-width input of the circuit S5 215 in order to form the correction values (error signal)

$$\Delta u_1,\ldots,\Delta u_k,\Delta w_{i1},\ldots,w_{iT}$$

of the bits $u_1,\ldots,u_k,w_{i1},\ldots,w_{iT}$, which are output at the outputs of the circuit S5 215.

If the set of bits $\{w_{i1},\ldots,w_{iT}\}$ contains the bits $w_{j1},\ldots,w_{jk}$, then it is possible to distinguish between all 1-bit errors in the bits $u_i$ and $w_{ji}$ for i=1,...,k. If T=t, then derivatives (derivative bits) are produced for all the bits u1,...,uk,w1,...,wt of the inner code C. If a subset of bits is not intended to be corrected, then there is no need for this subset to be contained in $\{w_{i1},\ldots,w_{iT}\}$.

The second input of the circuit S5 215 is connected to the output of the circuit S3 213, while the output of the circuit S1 211 is passed to the first input of the circuit S5 215.

That output of the circuit S5 215 which carries the value $\Delta u_i$ is connected for i=1,...,k to the first input of an XOR gate 216/i, to whose second input the signal $u_i$ (bit in the coded bit sequence) is passed, and at whose output the corrected signal $u_i$(corr) (corrected bit in the coded bit sequence) is output. For example, XOR logic gates 216/1-216/k, 217/1-217/T can provide a 1-bit error correction unit.

That output of the circuit S5 215 which carries the value $\Delta w_j$ is connected for j=1,..., T to the first input of an XOR gate 217/j, to whose second input the signal $w_j$ (bit in the coded bit sequence) is passed, and at whose output the corrected signal $w_j$(corr) (corrected bit in the coded bit sequence) is output.

Figure 3:
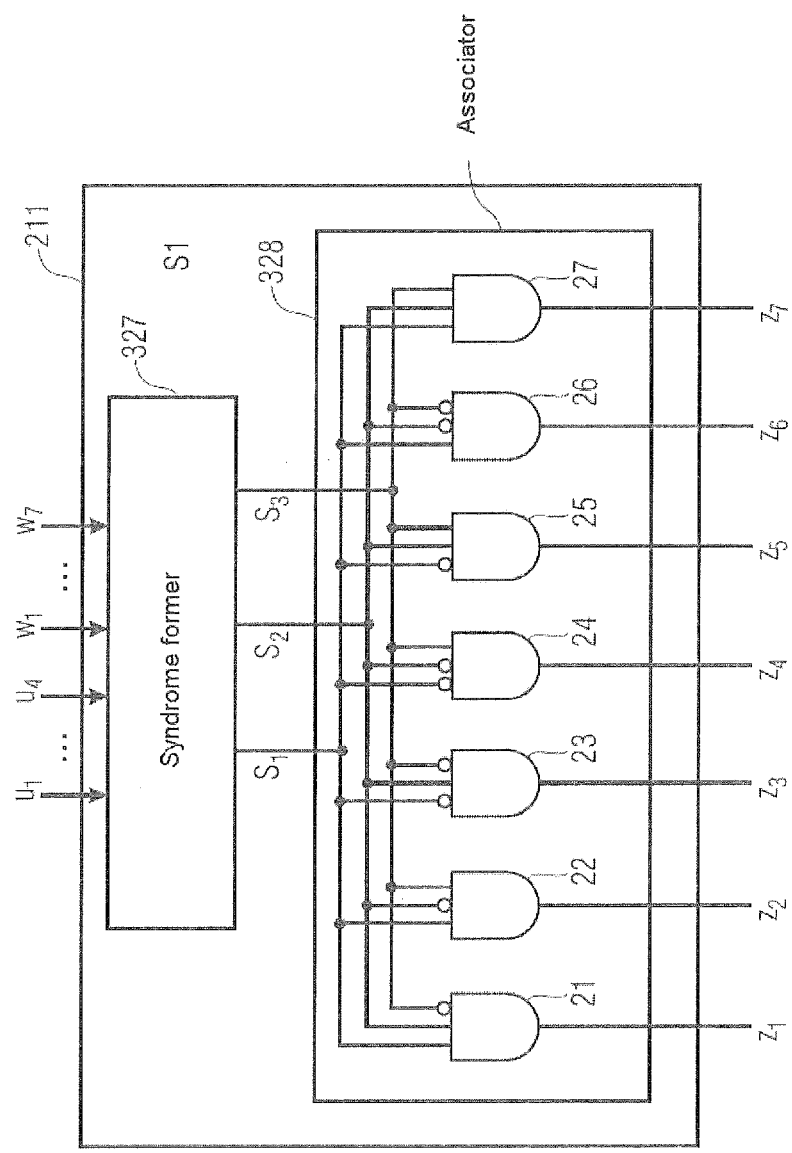
FIG. 3 shows a circuit diagram of an error position determiner of the inner code.

FIG. 3 shows one specific embodiment of the circuit S1 211 for k=4 and t=7, in order to provide the decoding function D. This consists of a syndrome former 327 (linear syndrome bit determiner), which is a combinational circuit having eleven binary inputs and three binary outputs (number of the linear check bits), and a downstream associator 328 (bit error identifier) for coding the syndrome values as possible error positions, which in FIG. 3 is formed from seven three-input AND gates 21, ...,27, and which provides the function D*. The binary values $u_1,\ldots,u_4$ and $w_1,\ldots,w_7$ are present at the correct locations at the k+t=11 inputs of the syndrome former 327. The syndrome former is simply one implementation of the components $s_1,s_2,s_3$ (linear syndrome bits) of the syndrome s of the inner code defined by the H matrix H of equation (1) where:

$$s_1 = u_1 + u_2 + w_1 + w_2 + w_4 + w_7$$

$$s_2 = u_1 + u_3 + w_1 + w_3 + w_4 + w_6$$

$$s_3 = u_1 + u_4 + w_2 + w_3 + w_4 + w_7$$

By way of example, the syndrome former 327 can be implemented using XOR gates.

The associater 328 for coding the syndrome values as possible error positions outputs a binary coding $z_1,\ldots,z_7$ (coded output signals from the error position determiner of the inner code) when $s_1,s_2,s_3$ are input. In this case, the possible error positions Cod(9), Cod(3,10), Cod(4,11), Cod(1,5), Cod(2,6), Cod(7), Cod(8) are coded as 1-from-7 code and Cod(0) is coded, for example, as 0,0,0,0,0,0,0 in accordance with the following table.

| $s_1$ | $s_2$ | $s_3$ | $z_1$ | $z_2$ | $z_3$ | $z_4$ | $z_5$ | $z_6$ | $z_7$ | Meaning | int. line |
|---|---|---|---|---|---|---|---|---|---|---|---|
| 0 | 0 | 0 | 0 | 0 | 0 | 0 | 0 | 0 | 0 | Cod(0) | 0 |
| 1 | 0 | 0 | 0 | 0 | 0 | 0 | 0 | 1 | 0 | Cod(9) | $y_9$ |
| 0 | 1 | 0 | 0 | 0 | 1 | 0 | 0 | 0 | 0 | Cod(3, 10) | $y_3, y_{10}$ |
| 0 | 0 | 1 | 0 | 0 | 0 | 1 | 0 | 0 | 0 | Cod(4, 11) | $y_4, y_{11}$ |
| 1 | 1 | 0 | 1 | 0 | 0 | 0 | 0 | 0 | 0 | Cod(1, 5) | $y_1, y_5$ |
| 1 | 0 | 1 | 0 | 1 | 0 | 0 | 0 | 0 | 0 | Cod(2, 6) | $y_2, y_6$ |
| 0 | 1 | 1 | 0 | 0 | 0 | 0 | 1 | 0 | 0 | Cod(7) | $y_7$ |
| 1 | 1 | 1 | 0 | 0 | 0 | 0 | 0 | 0 | 1 | Cod(8) | $y_8$ |

For example, the syndrome $s=s_1 s_2 s_3=000$ in the first row of the table corresponds to the coding 0000000 or Cod(0), which indicates an error-free word; the syndrome 010 in the third row of the table indicates the coding 0010000 or Cod(3,10), which means that it is not possible to distinguish on the basis of the output from the circuit S1 211 whether there is a 1-bit error in the third bit $u_3$ or in the 10-th bit $w_6$.

The associater 328 for coding the syndrome values corresponding to the table will now be described in detail, by way of example. The three outputs of the syndrome former, which carry the values of the syndrome $s_1, s_2$ and $s_3$, are connected in the correct locations to the three inputs of the associater 328. The first input of the associater 328, which carries the value $s_i$ (linear check bit) of the syndrome, is at the same time passed directly to the first input of the AND gates 21, 22, 26 and 27, and is passed inverted to the first input of the AND gates 23, 24 and 25. The second input of the associater 328, which carries the value of the syndrome, is at the same time passed directly to the second input of the AND gates 21, 23, 25 and 27, and is passed inverted to the second input of the AND gates 22, 24 and 26.

The third input of the associater 328, which carries the value $s_3$ of the syndrome, is at the same time passed directly to the first input of the AND gates 22, 24, and 27 and is passed inverted to the first input of the AND gates 21, 23 and 26. For $i=1, \ldots, 7$ the output of the AND gate $2i$, which carries the output signal $z_i$, is the i-th output of the circuit S1 11.

The non-linear function $$\phi(u,w) = u_1+u_2+u_3+u_4+(u_1+w_1)(u_2+w_2)+(u_3+u_6)(u_4+u_7)+w_3 \cdot u_4$$

is chosen as an example of a non-linear function in the exemplary embodiment under consideration, and is implemented by the circuit S2 212 in FIG. 2.

The output of the circuit S2 212, which carries the value $\phi(u,w)$ (non-linear check bit), is XOR-linked in the circuit S3 213 with the value of the bit $\epsilon$ (non-linear comparison check bit which is produced). The circuit S3 213 therefore outputs the value (of the non-linear syndrome bit)

$$\Delta\epsilon = \epsilon + \phi(u,v)$$

at its output.

The Boolean derivatives are given by:

$$\frac{\delta\phi}{\delta u_1} = u_1 + 1 + u_2 + u_3 + u_4 + (u_1 + 1 + w_1)(u_2 + w_2) +$$
$$(u_3 + w_6)(u_4 + w_7) + w_3 u + u_1 + u_2 + u_3 + u_4 +$$
$$(u_1 + w_1)(u_2 + w_2) + (u_3 + w_6)(u_4 + w_7) + w_3 w_4$$
$$= 1 + u_2 + w_2,$$

$$\frac{\delta\phi}{\delta u_2} = 1 + u_1 + w_1,$$

$$\frac{\delta\phi}{\delta u_3} = 1 + u_4 + w_7,$$

$$\frac{\delta\phi}{\delta u_4} = 1 + u_3 + w_6,$$

$$\frac{\delta\phi}{\delta w_1} = u_2 + w_2,$$

$$\frac{\delta\phi}{\delta w_2} = u_1 + w_1,$$

$$\frac{\delta\phi}{\delta w_3} = w_4,$$

$$\frac{\delta\phi}{\delta w_4} = w_3,$$

$$\frac{\delta\phi}{\delta w_5} = 0,$$

$$\frac{\delta\phi}{\delta w_6} = u_4 + w_7,$$

$$\frac{\delta\phi}{\delta w_7} = u_3 + w_6.$$

Figure 4:
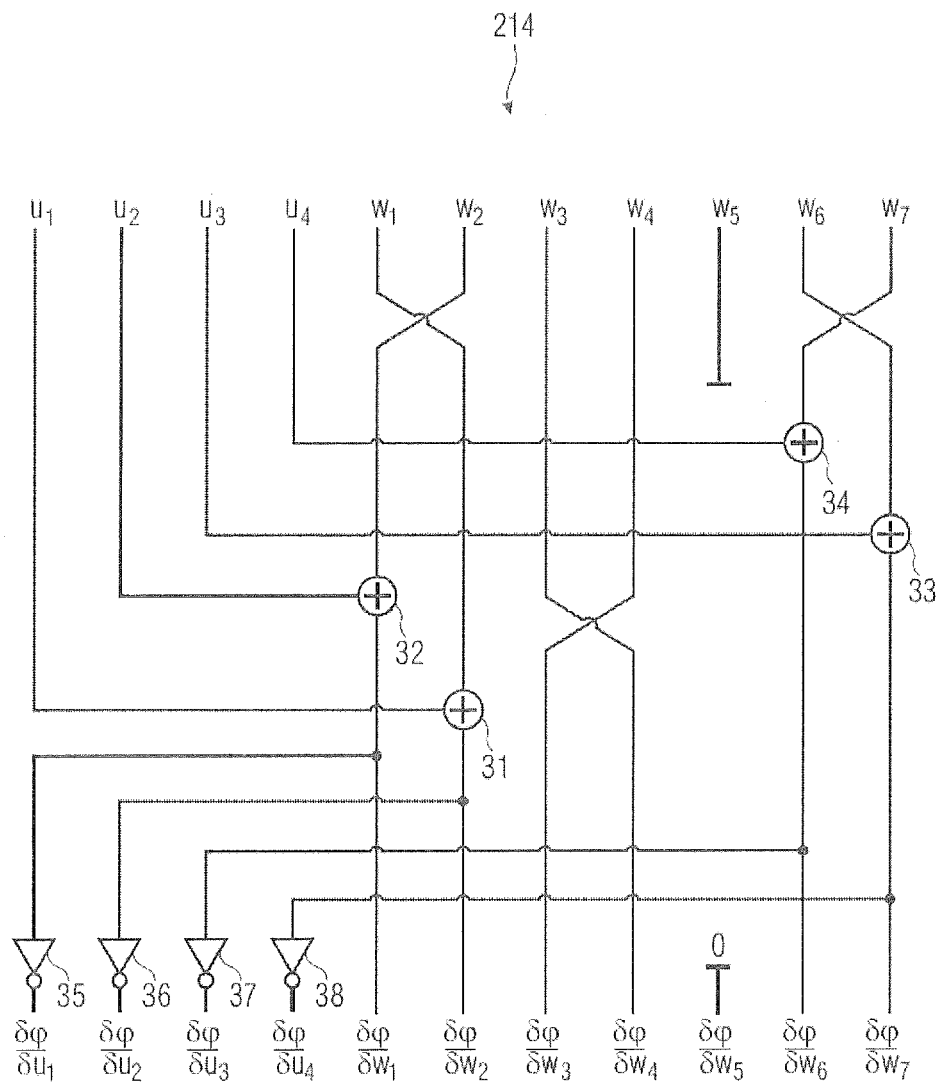
FIG. 4 shows a circuit diagram of a derivative determiner.

These derivatives are formed by the circuit S4 14. FIG. 4 shows one possible implementation of the circuit S4 14.

As can be seen, for $i=1, \ldots, k$, where $k=4$, $$\frac{\delta\phi}{\delta u_i} = \frac{\delta\phi}{\delta w_{ji}} + 1,$$

and therefore $$\frac{\delta\phi}{\delta u_i} \text{ from } \frac{\delta\phi}{\delta w_{ji}} \text{ or } \frac{\delta\phi}{\delta w_{ji}} \text{ from } \frac{\delta\phi}{\delta u_i}$$

can be determined simply by negation, as a result of which the implementation of the circuit S4 214 is particularly simple in FIG. 4.

In FIG. 4, the outputs which carry the values $$\frac{\delta\phi}{\delta u_i}$$

(derivative bits) are derived by the negaters 35, 36, 37, 38 (inverters) from the outputs which carry the values $$\frac{\delta\phi}{\delta w_{ji}}.$$

It is likewise possible to derive the outputs which carry the values $$\frac{\delta\phi}{\delta w_{ji}}$$

by simple negation from the outputs which carry the values $$\frac{\delta\phi}{\delta u_i},$$

which is worthwhile when corresponding XNOR gates, for example, are used instead of the XOR gates 31, 32, 33, 34.

The circuit S4 214 for determination of the derivatives (the values of the derivative bits) will now be described in detail, by way of example. The circuit S4 214 in FIG. 3 has eleven inputs, at which the values $u_1, \ldots, u_4, w_1, \ldots, w_7$ are present at the correct locations, and eleven outputs, which carry the values $$\frac{\delta\varphi}{\delta u_1}, \ldots, \frac{\delta\varphi}{\delta u_4}, \frac{\delta\varphi}{\delta w_1}, \ldots, \frac{\delta\varphi}{\delta w_7}.$$

In the XOR gate 31, the input line which carries the input signal $u_1$ is XOR-linked to the input line which carries the input signal $w_1$. The output of the XOR gate 31 is connected directly to the output line which carries the signal $$\frac{\delta\varphi}{\delta w_2}$$

(derivative bit of the bit $w_2$ in the coded bit sequence), and is connected via an inverter 36 to the output line which carries the signal $$\frac{\delta\varphi}{\delta u_2}$$

(derivative bit of the bit $u_2$ in the coded bit sequence).

In the XOR gate 32, the input line that carries the input signal $u_2$ is XOR-linked to the input line which carries the input signal $w_2$. The output of the XOR gate 32 is connected directly to the output line that carries the signal $$\frac{\delta\varphi}{\delta w_1}$$

and is connected via an inverter 35 to the output line that carries the signal $$\frac{\delta\varphi}{\delta u_1}.$$

In the XOR gate 33, the input line that carries the input signal $u_3$ is XOR-linked to the input line which carries the input signal $w_6$. The output of the XOR gate 33 is connected directly to the output line that carries the signal $$\frac{\delta\varphi}{\delta w_7}$$

and is connected via an inverter 38 to the output line that carries the signal $$\frac{\delta\varphi}{\delta u_4}.$$

In the XOR gate 34, the input line that carries the input signal $u_4$ is XOR-linked to the input line which carries the input signal $w_7$. The output of the XOR gate 34 is connected directly to the output line that carries the signal $$\frac{\delta\varphi}{\delta w_2}$$

and is connected via an inverter 37 to the output line that carries the signal $$\frac{\delta\varphi}{\delta u_3}.$$

The input that carries the signal $w_3$ is connected directly to the output that carries the signal $$\frac{\delta\varphi}{\delta w_4}.$$

The input that carries the signal $w_4$ is connected directly to the output that carries the signal $$\frac{\delta\varphi}{\delta w_3}.$$

The output that carries the signal $$\frac{\delta\varphi}{\delta w_5}$$

is constantly equal to 0, since the non-linear function $\phi$ does not depend on $w_5$.

Figure 5:
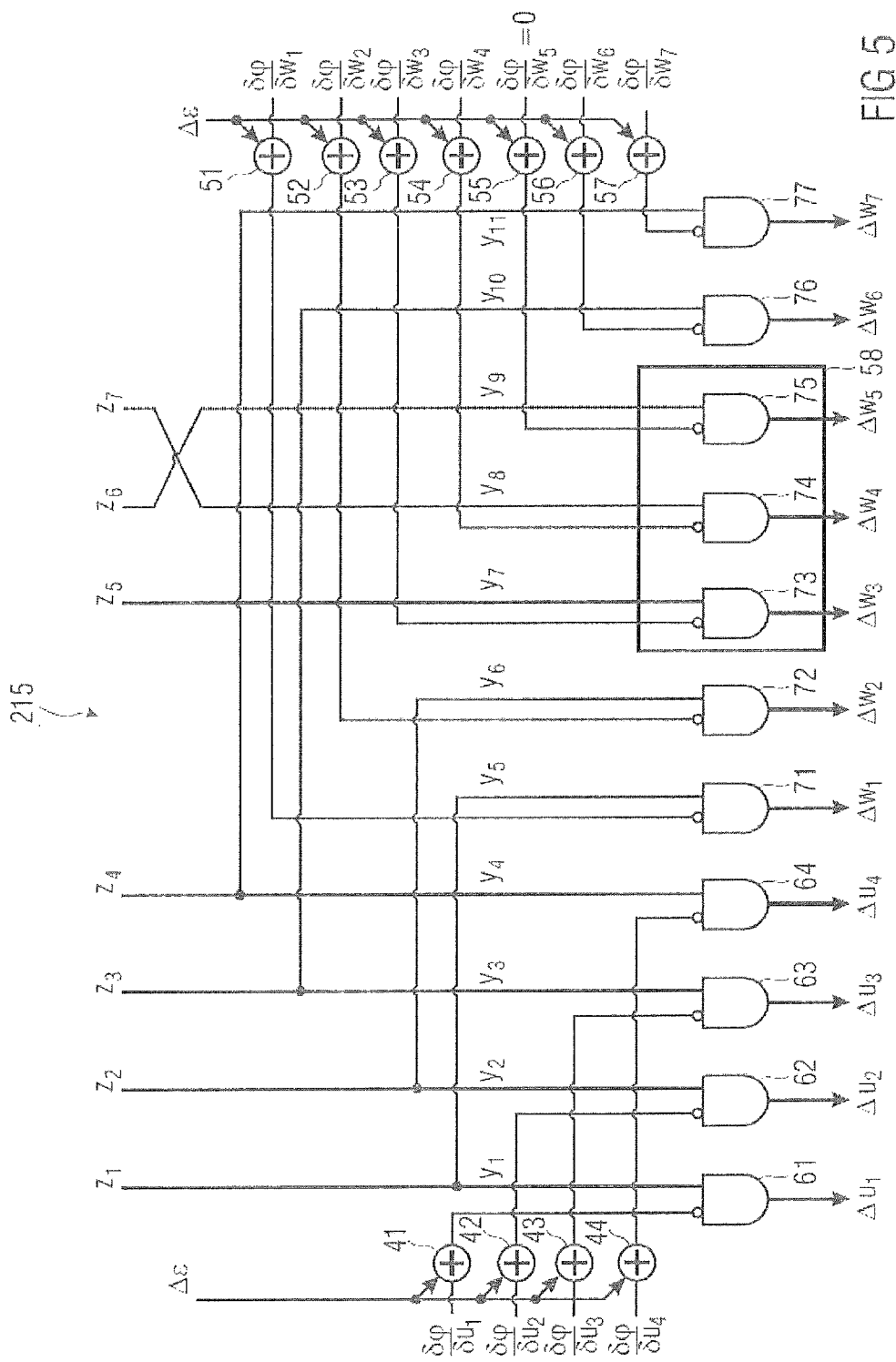
FIG. 5 shows a circuit diagram of an overall error position determiner.

FIG. 5 shows one specific implementation of the circuit S5 215 from FIG. 2.

The circuit in FIG. 5 has seven binary inputs into which the bits $z_1, z_2, z_3, z_4, z_6, z_6, z_7$ (coded output signals from the error position determiner of the inner code) are input and which form the first input of the circuit, and a second input, into which the value $\Delta\epsilon$ is input.

Furthermore, the circuit shown in FIG. 5 has eleven binary inputs, that carry the values $$\frac{\delta\varphi}{\delta u_1}, \ldots, \frac{\delta\varphi}{\delta u_4}, \frac{\delta\varphi}{\delta w_1}, \ldots, \frac{\delta\varphi}{\delta w_7}$$

(derivative bits), and form the third input of the circuit. This has eleven outputs, at which the values $\Delta u_1, \ldots, \Delta u_4, \Delta w_1, \ldots, \Delta w_7$ (error signals) are output for correction of the bits As already stated, in specific situations there may be no need to correct all the bits $u_1, \ldots u_4, w_1, \ldots w_7$. For example, if the bits $w_3, w_4, w_5$ do not need to be corrected, then the outputs for the circuit in FIG. 4 which carry the values $\Delta w_3, \ldots, \Delta w_4, \Delta w_5$ can be omitted. In other words, the error position determiner of the inner code determines only one possible error position for a bit error, as a result of which all that is now required is to identify the bit error as a 1-bit error.

In this case, the circuit part 58 of the circuit S5 in FIG. 5 can be omitted. The circuit in FIG. 5 will now be described in detail, by way of example.

That input that carries the signal $z_1$ is connected to the internal lines $y_1$ and $y_5$.

That input that carries the signal $z_2$ is connected to the internal lines $y_2$ and $y_6$.

That input that carries the signal $z_3$ is connected to the internal lines $y_3$ and $y_{10}$.

That input that carries the signal $z_4$ is connected to the internal lines $y_4$ and $y_1$.

That input that carries the signal $z_5$ is connected to the internal line $y_7$.

That input that carries the signal $z_6$ is connected to the internal line $y_9$.

That input that carries the signal $z_7$ is connected to the internal line $y_8$.

$$\frac{\delta\varphi}{\delta u_i}$$

For i=1, . . . ,4 that input that carries the signal is connected to the first input of an XOR gate 4*i*, at whose second input the value $\Delta\epsilon$ is present and whose output is passed, negated, to the first input of an AND gate 6*i*, whose second input is connected to the line $y_{i+4}$ and whose output carries the correction signal $\Delta u_i$.

For j=1, . . . ,7 that input that carries the signal $$\frac{\delta\varphi}{\delta w_j}$$

is connected to the first input of an XOR gate 5*j*, at whose second input the value $\Delta\epsilon$ is present, and whose output is passed in negated form to the first input of an AND gate 7*j*, whose second input is connected to the line $y_j$, and whose output carries the correction signal $\Delta w_j$.

The following text will now explain how the distinction is drawn between a correction of $u_1$ and $w_1$ on the basis of $\Delta\epsilon$ and the values $$\frac{\delta\varphi}{\delta u_1} \text{ and } \frac{\delta\varphi}{\delta w_1}.$$

For example, if $u_1$ has been incorrectly changed to $\overline{u}_1$, then $$\Delta\epsilon = \frac{\delta\varphi}{\delta u_1} = 1 + u_2 + w_2.$$

Or, for example, if $w_1$ has been incorrectly changed to $\overline{w}_1$, then $$\Delta\epsilon = \frac{\delta\varphi}{\delta w_1} = u_2 + w_2.$$

If $z_1$=1 and therefore $y_1=y_5=z_1=1$, then $$\Delta u_1 = 1 \text{ if } \Delta\epsilon + \frac{\delta\varphi}{\delta u_1} = 0$$

and $$\Delta w_1 = 1 \text{ if } \Delta\epsilon + \frac{\delta\varphi}{\delta w_1} = 0$$

In this case:

$$\frac{\delta\varphi}{\delta u_1} \neq \frac{\delta\varphi}{\delta w_1}$$

If, because of an error for I=3,4,5, $$\Delta\epsilon + \frac{\delta\varphi}{\delta w_I} = 0$$

and $z_5$, $z_7$ or $z_6$ is equal to 1, then the corresponding $\Delta w_1$ is equal to 1. If $$\Delta\epsilon + \frac{\delta\varphi}{\delta w_I} = 1,$$

and the corresponding $z_5$, $z_7$ or $z_6$ is equal to 1, then an uncorrectable error is present (multi-bit error).

For example, if z=0000010 and therefore $z_6$=1 (which corresponds to Cod(9)) and therefore $y_9$=1, then $\Delta w_5$=1, if $$\Delta\epsilon + \frac{\delta\varphi}{\delta w_5} = 0$$

$$\Delta\epsilon + \frac{\delta\varphi}{\delta w_5} = 1,$$

then w5 is not corrected. An uncorrectable multi-bit error is then present.

The signals $\Delta u_1, \ldots, \Delta u_4, \Delta w_1, \ldots, \Delta w_7$ are XOR-linked to the signals $u_1, \ldots, u_4, w_1, \ldots, w_7$ for correction.

A further check bit $\pi$ can be added for better error identification, forming the parity over all the bits $u_1, \ldots, u_k$, $w_1, \ldots, w_t$ and the bit $\epsilon$, $$\pi = u_1 + u_2 + \ldots + u_k + w_1 + \ldots + w_t + \epsilon.$$

If the inner code already unambiguously determines the position of a 1-bit error, as is the case in the example for 1-bit errors at the positions 7, 8 and 9, then the non-linear syndrome bit of the outer code provides an additional check equation. This check equation is always satisfied after correct correction of a 1-bit error. In the event of incorrect correction of a multi-bit error, there is a probability of being able to identify that a multi-bit error is present rather than a 1-bit error. There is therefore a probability of being able to decide whether a single-bit error is present on the basis of the discrepancy $\Delta\epsilon$ (non-linear syndrome bit) between the calculated value of the check function and the bit value $\epsilon$ that is read (non-linear comparison check bit that is produced) as well as the derivatives of the non-linear check function (derivative bit). If the inner code can reliably determine all the positions of all 1-bit errors, then the use of the non-linear check function and of the proposed decoding using the derivative of the non-linear function increases the probability of identifying multi-bit errors.

Some exemplary embodiments according to the invention relate to a circuit arrangement for correction of 1-bit errors in n-position binary words $v=(u,w,\epsilon)$ where $u=u_1, \ldots, u_k$, $w=w_1, \ldots, w_t$ and $k \leq t$, where $u_1, u_2, \ldots, u_k, w_1, \ldots, w_t, \epsilon \in \{0,1\}$, where (u,w) are elements of an inner code C, with the bit $\epsilon$ being determined by $$\epsilon = \phi(u_1, \ldots, u_k, w_1, \ldots, w_t)$$

and $\phi$ being a non-linear Boolean function, wherein a decoding function $D(u_1, \ldots, u_k, w_1, \ldots, w_t)$ and a non-empty subset $TM_w \subset \{w_1, \ldots, w_t\}$ consisting of k elements exist, as a result of which one and only one $w_{ji} \in TM_w$ exists for each $u_i \in \{u_1, \ldots, u_k\} = U$ such that (u,w) $\in$ C applies to all code words in the inner code: that is to say $$D(u_1, \ldots, u_{i-1}, \overline{u_i}, u_{i+1}, \ldots, u_k, w_1, \ldots, w_{ji-1}, \overline{w_{ji}}, w_{ji+1}, \ldots, w_t) = D(u_1, \ldots, u_k, w_1, \ldots, w_t) = \text{Cod}(i,ji)$$

for all $u_i \in U$, where Cod i,ji is a coding of the bit positions of the bit $u_i$ and of the bit $w_{ji}$, where $$D(u_1, \ldots, u_k, w_1, \ldots, w_{r-1}, \overline{w_r}, w_{r+1}, \ldots, w_t) = \text{Cod}(r)$$

for $w_r \in w_1, \ldots, w_t\} \backslash TM_w$ and Cod(r) is a coding of the bit position of the bit $w_r$, where D u,v=Cod 0 for all code words (u,v) of the inner code C, and Cod(0) is a coding to indicate that no error is corrected, where $$\frac{\delta \phi}{\delta u_i} \neq \frac{\delta \phi}{\delta w_{ji}}$$

for $u_i \in U$, and where k+t+1=n.

In this case, a first partial circuit S1 211 is provided for implementation of the decoding function D, wherein the partial circuit 51 211 has k+t binary inputs, at which the values $u,w=u_1, \ldots u_k, w_1, \ldots, w_t$ are present and, in the situation when no error is present, outputs at its output the value Cod (0), outputs the value Cod(i,j$_i$) in the situation when there is a 1-bit error in the bit $u_i \in U$ or in the bit $w_r \in TM_w$, and outputs the value Cod(r) in the situation when there is a 1-bit error in the bit $w_r \in \{w_1, \ldots, w_t\} \backslash TM_w$.

Furthermore, a second partial circuit S2 212 having k+1 binary inputs and one binary output is provided for implementation of the Boolean function $\phi$, at whose k+t binary inputs the binary values $u_1, \ldots, u_k, w_1, \ldots, w_t$ are present and at whose output the value $\phi[u_1, \ldots, u_k, w_1, \ldots w_t)$ is output.

A third partial circuit S3 213 having two binary inputs and one binary output is provided to form the difference $\Delta \epsilon = \phi(u1, \ldots, uk, w1, \ldots, wt)$, at whose first input the c is present and whose second input is connected to the output of the second partial circuit, and wherein the circuit S3 outputs at its output the XOR-linked values which are present at its two inputs.

Furthermore, a fourth partial circuit S4 214 having k+t binary inputs and k+T binary outputs is provided for determination of the Boolean derivatives $$\frac{\delta \phi}{\delta u_1}, \ldots, \frac{\delta \phi}{\delta u_k}, \ldots, \frac{\delta \phi}{\delta w_{i1}}, \ldots, \frac{\delta \phi}{\delta w_{iT}}$$

wherein the values $u_1, \ldots, u_k, w_1, \ldots, w_t$ are present at the k+t inputs of the partial circuit S4 14, and T$\leq$t.

Furthermore, a fifth partial circuit S5 15 is provided for formation of the correction values and has a first, a second and a third input and an output with a width of k+T bits, wherein the first input is connected to the output of the first partial circuit S1 211, the second input is connected to the output of the third partial circuit S3 213, and the third input, which has a width of k+T bits, is connected to the output, which likewise has a width of k+T bits, of the fourth partial circuit S4 214, such that the output, which has a width of k+T bits, of the circuit S5 215 carries the k+T correction values $\Delta u_1, \ldots, \Delta u_k$, $\Delta w_{i1}, \ldots, \Delta w_{iT}$ which are XOR-linked to the bits $u_1, \ldots, u_k, w_{i1}, \ldots, w_{iT}$.

In this case, according to one aspect, t=T.

Furthermore, by way of example, the partial circuit S1 211 is a series circuit of a syndrome former 29 of the inner code and of an associater 28, wherein the non-linear function $\phi(u_1, \ldots u_k, w_1, \ldots, w_t)$ is in the form $\phi(u_1, \ldots, u_k, w_1, \ldots, w_t) = u_1 + \ldots, u_k + \lambda(u_1 + w_{jl}, \ldots, u_k + w_{jk}, w_{il}, \ldots, w_{i(t-k)})$ and $\lambda$ is a non-linear function.

In addition, a parity bit can be provided.

Optionally, the circuit S4 14 for derivative formation can be implemented such that a negater 35, 36, 37, 38 is connected to at least one output of this circuit, at which the derivative $$\frac{\delta \phi}{\delta w_{ji}}$$

is output, and the derivative $$\frac{\delta \phi}{\delta u_i}$$

is output at the output of said negater 35, 36, 37, 38.

Alternatively or additionally, the circuit S4 214 for derivative formation can be implemented such that a negater is connected to at least one output of this circuit, at which the derivative $$\frac{\delta \phi}{\delta u_i}$$

is output, with the derivative $$\frac{\delta \phi}{\delta w_{ji}}$$

being output at the output of said negater.

Figure 7:
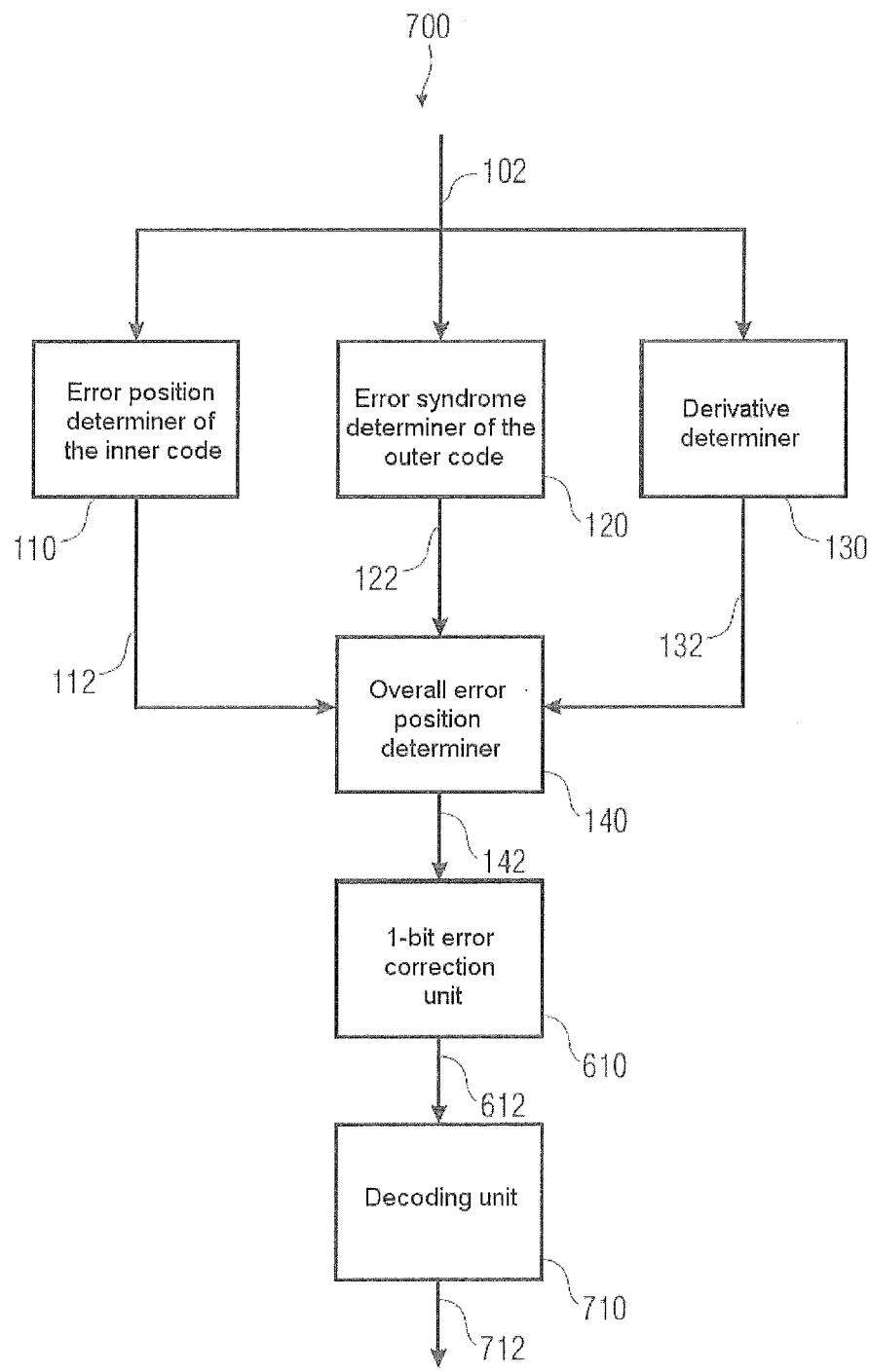
FIG. 7 shows a block diagram of a decoder for decoding an incorrect, coded bit sequence.

Some exemplary embodiments according to the invention relate to a decoder for decoding an incorrect, coded bit sequence. FIG. 7 shows a block diagram of a decoder 700 such as this for decoding an incorrect, coded bit sequence 102, corresponding to one exemplary embodiment according to the invention. The design of the decoder 700 is similar to the apparatus, shown in FIG. 6, for correction of a 1-bit error in a coded bit sequence, but additionally has a decoding unit 710. In this case, the 1-bit error correction unit 610 is connected to the decoding unit 710. The decoding unit 710 decodes the corrected, coded bit sequence 612 in order to obtain a decoded bit sequence 712. The error position determiner of the inner code 110, the error syndrome determiner of the outer code 120, the derivative determiner 130, the overall error position determiner 140 and the 1-bit error correction unit 610 can be implemented in different ways, as has been described above with reference to FIGS. 1a, 1b and 6, and with reference to the specific exemplary embodiment shown in FIGS. 2 to 5.

The 1-bit error correction unit 610 and/or the decoding unit 710 may, for example, in the same way as the error position determiner of the inner code 110, the error syndrome determiner of the outer code 120, the derivative determiner 130 and/or the overall error position determiner 140, be independent hardware units or part of a computer or microcontroller, as well as a computer program or a software product for running on a computer or microcontroller.

Some exemplary embodiments according to the invention relate to a memory unit (for example a RAM, a flash memory or a hard disk) having an apparatus for correction of a 1-bit error in a coded bit sequence based on the described concept.

Some further exemplary embodiments according to the invention relate to an apparatus for determination of a position of a 1-bit error in a bit sequence which is coded by means of an inner code and an outer non-linear code, which comprises an apparatus for determination of an error position of the inner code, an apparatus for determination of an error syndrome of the outer code, an apparatus for determination of a derivative bit and an apparatus for determination of an overall error position. The apparatus for determination of an error position of the inner code determines at least one possible error position of a bit error in the coded bit sequence on the basis of the inner code. The apparatus for determination of an error syndrome of the outer code determines a value of a non-linear syndrome bit of the outer code on the basis of a non-linear function of bits in the coded bit sequence. Furthermore, the apparatus for determination of a derivative bit for at least one determined, possible error position of the bit error determines a value of a derivative bit on the basis of a derivative of the non-linear function based on the bit at the determined, possible error position in the coded bit sequence. Furthermore, the apparatus for determination of an overall error position determines an error position of the bit error on the basii of the non-linear syndrome bit and at least one derivative bit, when the apparatus for determination of an error position of the inner code determines more than one possible error position of the bit error. Alternatively, the apparatus for determination of an overall error position identifies the bit error as a 1-bit error on the basis of the non-linear syndrome bit and a derivative bit of a determined, possible error position, and thus identifies the determined, possible error position as the error position of the 1-bit error when the apparatus for determination of an error position of the inner code determines only one possible error position of the bit error in the coded bit sequence.

Figure 11:
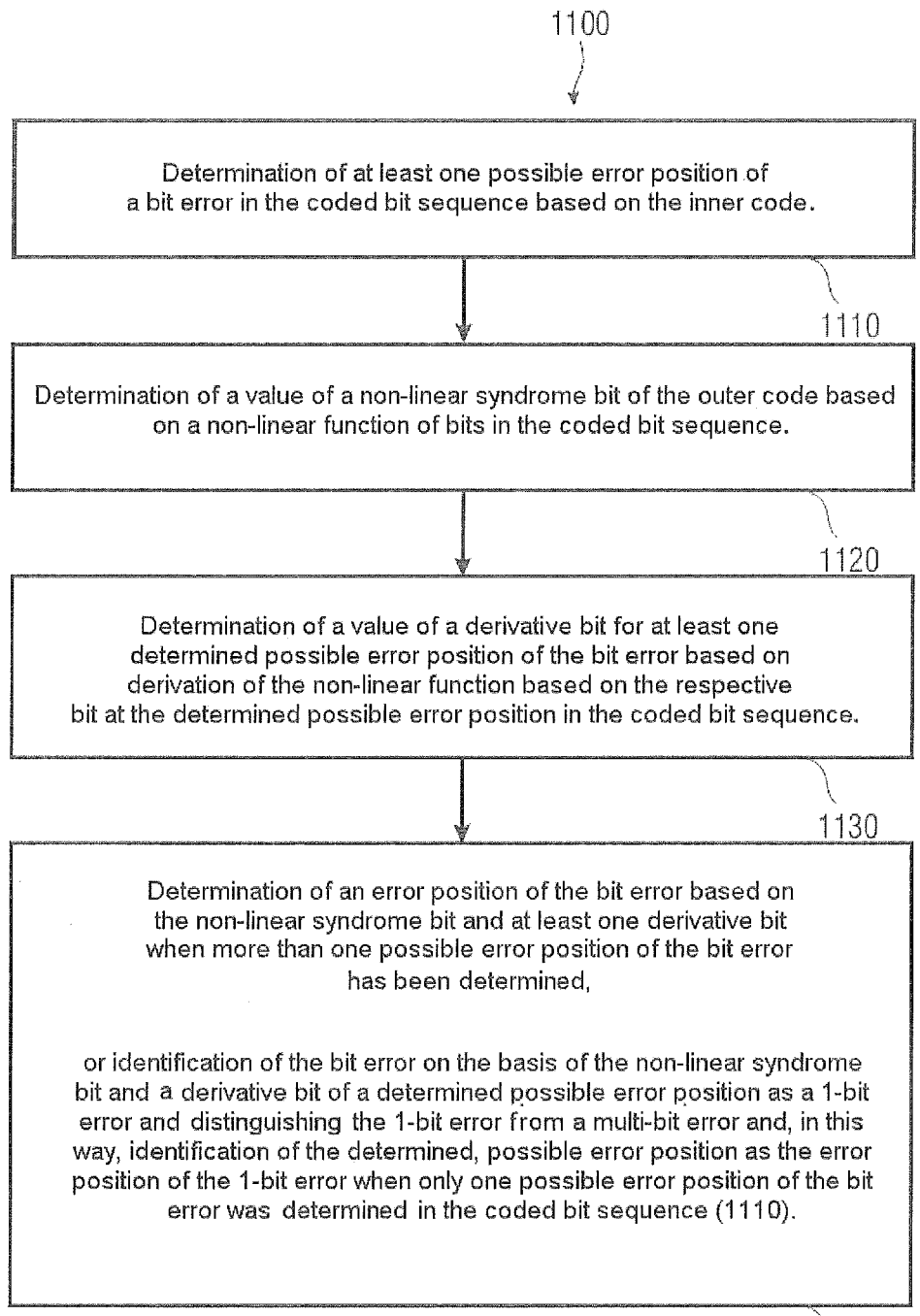
FIG. 11 shows a flowchart of a method for determination of a position of a 1-bit error in a coded bit sequence.

FIG. 11 shows a flowchart of a method 1100 for determination of a position of a 1-bit error in a bit sequence that is coded by means of an inner code and an outer non-linear code, corresponding to one exemplary embodiment of the invention. The method 1100 comprises determination 1110 of at least one possible error position of a bit error in the coded bit sequence on the basis of the inner code and determination 1120 of a value of a non-linear syndrome bit of the outer code on the basis of a non-linear function of bits in the coded bit sequence. Furthermore, the method 1100 comprises determination 1130 of a value of a derivative bit for at least one determined, possible error position of the bit error on the basis of derivation of the non-linear function based on the respective bit at the determined, possible error position in the coded bit sequence. Furthermore, the method 1100 comprises determination 1150 of an error position of the bit error on the basis of the non-linear syndrome bit and at least one derivative bit when more than one possible error position of the bit error has been determined 1110, or identification 1160 of the bit error as a 1-bit error on the basis of the non-linear syndrome bit and a derivative bit at a determined, possible error position, and distinguishing the 1-bit error from a multi-bit error and in this way identification of the determined, possible error position as the error position of the 1-bit error if only one possible error position of the bit error has been determined in the coded bit sequence 1110.

The method 1100 may comprise further method steps, that correspond to the aspects of the concept according to the invention as described above.

A number of exemplary embodiments according to the invention relate to a method for correction of a 1-bit error in a coded bit sequence, that comprises a method for determination of a position of a 1-bit error in a coded bit sequence, as has been described above, and a change to a value of the bit at the determined or identified error position in the coded bit sequence, in order to correct the 1-bit error.

Some further exemplary embodiments according to the invention relate to a method for decoding of an incorrect, coded bit sequence, that comprises a method for correction of a 1-bit error, as described above, and decoding of the corrected, coded bit sequence, in order to obtain a decoded bit sequence.

Some exemplary embodiments according to the invention relate to a decoding circuit for non-linear Vasil'ev codes. By way of example, the described concept can simplify the decoding logic of non-linear 1-bit-error-correcting and 2-bit-error identification codes (SEC-DED codes, SEC-DED is an acronym for single-error correction, double-error detection). The proposed concept makes it possible to increase the speed of the decoding circuit, making it technically possible to advantageously use codes having a plurality of non-linear syndrome bits (referred to in the following text as Vasil'ev-2). The described concept can be applied to extended Vasil'ev and related codes which it has not been possible to use in practice until now, because of the complex and slow decoding.

(Abbreviated) Hsiao codes are currently often used in practice as codes which correct 1-bit errors and identify 2-bit errors for memories of the typical word widths of 16, 32, 64 bits etc. Extended Vasil'ev codes with the same word width allow considerably better identification of permanent errors with three or more incorrect bit locations.

The probability with undefined errors are identified is dependent only on the number of the check bit, irrespective of the code used. However, linear codes identify the same errors for each stored code word—and therefore one subset of the errors is always identified and a second subset of the errors is never identified. In the case of non-linear codes, in contrast, different errors are identified depending on the stored code word. The errors for Vasil'ev codes are therefore subdivided into three subsets. A first subset of the errors is always identified as incorrect, the second subset is identified with a probability of ½ (this applies to Vasil'ev-1 codes, in the case of Vasil'ev-2 codes, the dependent identification probability is ≧¼ in each clock cycle.) The subset of the errors which are never identified is small, and their relative proportion decreases to a major extent as the word width rises. Therefore, in the case of non-linear codes, the probability of identification failure decreases exponentially with the number of stored words and read-write cycles, for virtually all permanent errors.

Figure 9:
FIG. 9 shows a diagram of a comparison of the components of identifiable 3-bit errors from different coding methods.
Figure 8:
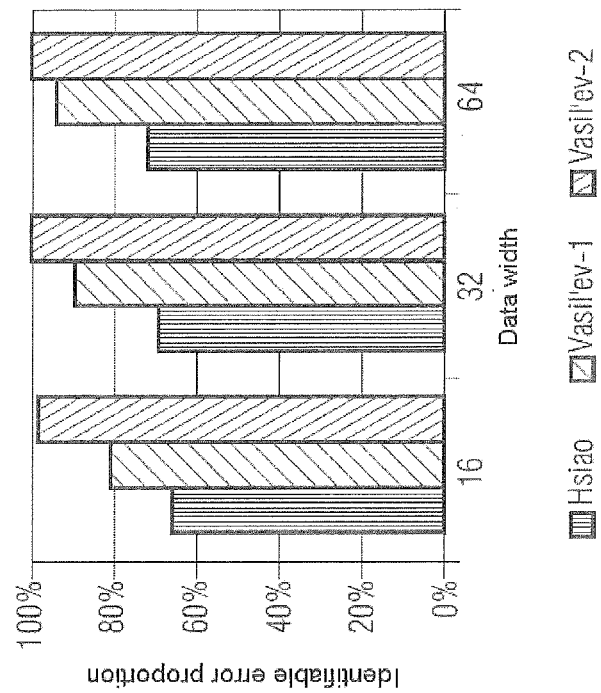
FIG. 8 shows a diagram of a comparison of the components of identifiable errors from different coding methods.
Figure 10:
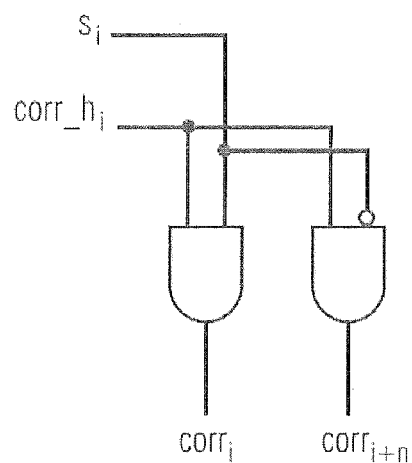
FIG. 10 shows a circuit diagram of syndrome decoding for the correction of the i-th and (1+n)-th bit using a known concept for linear codes.

FIG. 8 shows the proportion of the errors that can be identified using linear and non-linear codes. In this case, Vasil'ev-1 denotes an extended Vasil'ev code with one non-linear syndrome bit, and Vasil'ev-2 denotes an extended Vasil'ev code with two non-linear syndrome bits. The proposed concept for the first time ever provides a practical capability to use Vasil'ev-2 codes. FIG. 9 illustrates the proportion of identifiable 3-bit errors for Hsiao, Vasil'ev-1 and Vasil'ev-2 codes, as well as linear even-odd codes (no even-odd code exists for 16 information bits). The even-odd codes are the best linear codes for identification of 3-bit errors. These are obtained by computer-based abbreviation of Hamming codes with the aim of maximum of 3-bit error identification. The identification performance for undefined errors and for 3-bit errors is listed in detail once again in the following tables.

TABLE 1

Capability to identify undefined errors

| (n, m) | Hsiao code | Vasil'ev-1 | Vasil'ev-2 |
|---|---|---|---|
| (22, 16) | 65.63% | 81.24% | 98.82% |
| (39, 32) | 69.53% | 89.06% | 99.99% |
| (72, 64) | 71.88% | 93.75% | >>99.99% |
| (137, 128) | 73.24% | 96.48% | >>99.99% |

TABLE 2

Capability to identify 3-bit errors

| Code | Data bits | reliably | 3-bit errors identified with probability (%) | never |
|---|---|---|---|---|
| Hsiao | 16 | 35.06% | 0.00% | 64.94% |
| Vasil'ev-1 | | 3.90% | 60.26% (p = ½) | 35.84% |
| Vasil'ev-2 | | 3.90% | 87.53% (p ≥ ¼) | 8.57% |
| Hsiao | 32 | 40.34% | 0.00% | 59.66% |
| Vasil'ev-1 | | 1.91% | 77.12% (p = ½) | 20.97% |
| Vasil'ev-2 | | 1.91% | 95.56% (p ≥ ¼) | 2.53% |
| Hsiao | 64 | 43.72% | 0.00% | 56.28% |
| Vasil'ev-1 | | 0.75% | 87.12% (p = ½) | 12.13% |
| Vasil'ev-2 | | 0.75% | 98.55% (p ≥ ¼) | 0.70% |
| Hsiao | 128 | 46.29% | 0.00% | 53.71% |
| Vasil'ev-1 | | 0.26% | 92.84% (p = ½) | 6.90% |
| Vasil'ev-2 | | 0.26% | 99.56% (p ≥ ¼) | 0.19% |

In the table "Capability to identify undefined errors", n and m in the first column denote the length of a code and the number of data bits. For example, the first row shows that a code of length 22 and with 15 data bits is considered. The first row in this table shows that 65.63% of all possible errors are identified for a Hsiao code, 81.24% of all possible errors are identified for a Vasil'ev-1 code, and 98.82% of all possible errors are identified for a Vasil'ev-2 code.

Vasil'ev-1 codes and Vasil'ev-2 codes are non-linear codes for which some of the errors can always be identified, some of the errors can be identified with a probability, and some of the errors can never be identified, with the proportion of the errors which can never be identified turning to 0 as the code length increases.

For example, the proportion of identified errors for a Vasil'ev-2 code of length 127 with 128 data bits is more than 99.99%.

The capability to identify 3-bit errors is illustrated in the table "Capability to identify 3-bit errors".

The corresponding percentages for the codes under consideration are shown for 16, 32, 64 and 128 data bits in the columns "reliably", "3-bit errors identified with probability" and "never". When an error is identified with probability, then it is identified with a probability of ½ for a Vasil'ev-1 code and with a probability of s ¼ for a Vasil'ev-2 code.

The 3-bit errors which are never identified decrease, in percentage terms, greatly as the code length increases.

Vasil'ev codes can be produced by duplication of an inner code and attachment of a non-linear check bit. Like Hamming codes, Vasirev codes are codes which correct 1-bit errors and can be extended by the addition of the parity over all the code word bits to' form codes which correct 1-bit errors and identify 2-bit errors. The following text describes an extended Vasil'ev code having a linear inner code (Vasil'ev-1), although the statements can easily be transferred to extended Vasil'ev codes, whose inner code is once again a Vasil'ev code (Vasil'ev-2).

A non-linear check bit is added to the inner code, and is calculated with the aid of a non-linear function over the bits of the inner code (u,w).

Until now, the values of the check functions of the inner code and the value of the non-linear check function have first of all been recalculated and compared with the stored check bit values for error identification. In this case, the discrepancy between the value of the non-linear check function and the stored check bit value is referred to as the non-linear syndrome.

When the check bits of the inner code indicate a single-bit error, a two-stage decoding method has been used until now. The inner code can be used to confirm whether the error is located either at the i-th or at the (i+n)-th location in the code word v (syndrome is $h_i$). The i-th memory location is first of all corrected on a trial-and-error basis, and the value of the non-linear check function is then determined again. If it is found on the basis of the recalculated syndrome value of the word which has been corrected on a trial-and-error basis that there is no longer any error present, then the correction of $u_i$ was successful. On the other hand, if a 2-bit error is present after the trial-and-error correction, then the correction of $u_i$ should be reversed, and $u_{i+n}$ should be corrected.

This considerably slows down the decoding in comparison to linear codes. On the basis of the previously known method, the use of non-linear inner codes (Vasil'ev-2) does not appear to be technically sensibly feasible since, in this case, four possible corrections would in fact have to be considered.

The concept according to the invention makes it possible to speed up the decoding by determining the position to be corrected directly with the aid of the Boolean derivative of the non-linear check function. In principle, the method can be applied to all non-linear functions. Although some aspects have been described in conjunction with an apparatus, it is self-evident that these aspects also represent a description of the corresponding method, as a result of which a block or a component of an apparatus should also be understood as meaning a corresponding method step or a feature of a method step. Analogously to this, aspects which have been described in conjunction with or as a method step also represent a description of a corresponding block or detail or feature of a corresponding apparatus.

Depending on the specific implementation requirements, exemplary embodiments of the invention can be implemented in hardware or in software. The implementation can be carried out using a digital memory medium, for example a floppy disk, a DVD, a Blueray disk, a CD, a ROM, a PROM, an EPROM, an EEPROM or a FLASH memory, a hard disk or some other magnetic or optical memory on which electronically readable control signals are stored which interact or can interact with a programmable computer system such that the respective method is carried out. The digital memory medium can therefore be computer-readable. Some exemplary embodiments according to the invention therefore comprise a data storage medium, which has control signals which can be read electronically and are able to interact with a programmable computer system such that one of the methods described herein is carried out.

In general, exemplary embodiments of the present invention can be implemented as a computer program product with a program code, wherein the purpose of the program code is to carry out one of the methods when the computer program product is run on a computer. By way of example, the program code can also be stored on a machine-readable non-transitory storage medium.

Other exemplary embodiments comprise the computer program for carrying out one of the methods described herein, wherein the computer program is stored on a machine-readable non-transitory storage medium.

In other words, one exemplary embodiment of the method according to the invention is therefore a computer program which has a program code for carrying out one of the methods described herein when the computer program is run on a computer. A further exemplary embodiment of the methods according to the invention is therefore a non-transitory data storage medium (or a digital memory medium or a computer-readable medium) on which the computer program for carrying out one of the methods described herein is recorded.

A further exemplary embodiment of the method according to the invention is therefore a data stream or a sequence of signals that represents the computer program for carrying out one of the methods described herein. The data stream or the sequence of signals may, for example, be configured such that it can be transferred via a data communication link, for example via the Internet.

A further exemplary embodiment comprises a processing device, for example a computer or a programmable logic component, which is configured or adapted to carry out one of the methods described herein.

A further exemplary embodiment comprises a computer, on which the computer program for carrying out one of the methods described herein is installed.

In some exemplary embodiments, a programmable logic component (for example a field-programmable gate array, an FPGA) can be used to carry out some or all of the functionalities of the methods described herein. In some exemplary embodiments, a field-programmable gate array can interact with a microprocessor in order to carry out one of the methods described herein. In general, in some exemplary embodiments, the methods are carried out by any desired hardware apparatus. This may be universally usable hardware such as a computer processor (CPU) or hardware which is specific for the method, for example an ASIC.

The exemplary embodiments described above represent only an illustration of the principles of the present invention. It is self-evident that modifications and variations of the arrangements and details described herein may be of interest to other specialists. The aim is therefore that the invention should be restricted only by the scope of protection of the following patent claims and not by the specific details, which have been presented herein on the basis of the description and the explanation of the exemplary embodiments.

What is claimed is:

1. An apparatus for determination of a position of a 1-bit error in a bit sequence that is coded by means of an inner code and an outer non-linear code, comprising:

an error position determiner of the inner code configured to determine at least one possible error position of a bit error in the coded bit sequence based on the inner code;

an error syndrome determiner of the outer code configured to determine a value of a non-linear syndrome bit of the outer code based on a non-linear function of bits in the coded bit sequence;

a derivative determiner configured to determine a value of a derivative bit for at least one determined, possible error position of the bit error, based on derivation of the non-linear function based on the bit at the determined, possible error position in the coded bit sequence; and an overall error position determiner configured to determine an error position of the bit error based on the non-linear syndrome bit and at least one derivative bit when the error position determiner of the inner code determines more than one possible error position of the bit error, or the overall error position determiner configured to identify the bit error as a 1-bit error based on the non-linear syndrome bit and a derivative bit of a determined, possible error position, and distinguish the 1-bit error from a multi-bit error, and thus identify the determined, possible error position as the error position of the 1-bit error when the error position determiner of the inner code determines only one possible error position of the bit error in the coded bit sequence.

2. The apparatus as claimed in claim 1, wherein the error position determiner of the inner code is configured to determine all the possible error positions of a bit error in the coded bit sequence based on the inner code.

3. The apparatus as claimed in claim 1, wherein the error position determiner of the inner code is configured to determine one and only one possible error position for a bit error, and wherein the overall error position determiner is configured to identify the bit error as a 1-bit error based on the non-linear syndrome bit and a derivative bit of the determined, possible error position, and distinguish the 1-bit error from a multi-bit error, and thus identify the determined, possible error position as the error position of the 1-bit error.

4. The apparatus as claimed in claim 1, wherein the error syndrome determiner of the outer code is configured to determine a value for a predefined number of non-linear syndrome bits based on a corresponding number of non-linear functions, wherein the error position determiner of the inner code is configured to determine a maximum of 2 raised to the power of the predefined number of non-linear syndrome bits of different possible error positions of a bit error, and the overall error position determiner is configured to identify the bit error as a 1-bit error based on the non-linear syndrome bits, and determine an error position of the 1-bit error based on the non-linear syndrome bits and at least 2 raised to the power of the number of non-linear syndrome bits of derivative bits.

5. The apparatus as claimed in claim 1, wherein the error position determiner of the inner code is configured to determine two possible error positions of a bit error, and wherein the overall error position determiner is configured to determine an error position of the 1-bit error based on the non-linear syndrome bit and two derivative bits.

6. The apparatus as claimed in claim 1, wherein derivation of the non-linear function based on the respective bit of two determined, possible error positions for the two determined, possible error positions results in a different derived function, wherein the derivative determiner is configured to calculate the value of a derivative bit based on the associated derived function.

7. The apparatus as claimed in claim 1, wherein the coded bit sequence is coded based on a Vasil'ev code.

8. The apparatus as claimed in claim 1, wherein a number of bits in the coded bit sequence is at least equal to 2 raised to the power of a number of linear check bits of the inner code.

9. The apparatus as claimed in claim 1, wherein the derivative determiner is configured to calculate a value of a derivative bit for each bit in the coded bit sequence based on derivation of the non-linear function based on the respective bit in the coded bit sequence.

10. The apparatus as claimed in claim 1, wherein the derivative determiner is configured to determine a value of a derivative bit based on a Boolean derivative.

11. The apparatus as claimed in claim 1, wherein the error syndrome determiner of the outer code is configured to calculate the determined value of the non-linear syndrome bit based on a calculation of a non-linear check bit and a comparison of the non-linear check bit with a value of a non-linear comparison check bit that is provided in the coded bit sequence, wherein the non-linear check bit and the non-linear comparison check bit that is provided can be calculated based on the non-linear function, and wherein the non-linear comparison check bit that is provided is associated with the coded bit sequence, or is contained in the coded bit sequence.

12. The apparatus as claimed in claim 1, wherein the inner code is a linear code.

13. The apparatus as claimed in claim 1, wherein the error position determiner of the inner code is configured to calculate values of a plurality of syndrome bits of the inner code based on a plurality of functions of bits in the coded bit sequence, and wherein the error position determiner of the inner code is configured to determine at least one possible error position of a bit error in the coded bit sequence based on the plurality of syndrome bits of the inner code.

14. The apparatus as claimed in claim 13, wherein the error position determiner of the inner code is configured to calculate the values of the plurality of syndrome bits of the inner code on the basis of a check matrix.

15. The apparatus as claimed in claim 1, wherein in the non-linear function each bit in the coded bit sequence, which the error position determiner of the inner code determines as a possible error position together with at least one further possible error position of a bit error, is contained at least once in a non-linear term.

16. The apparatus as claimed in claim 1, wherein the error position determiner of the inner code comprises a plurality of AND logic gates and is configured to calculate the at least one possible error position based on the plurality of AND logic gates, wherein each AND logic gate in the plurality of logic gates has in each case one input for a syndrome bit of the inner code.

17. The apparatus as claimed in claim 1, wherein the derivative determiner is configured to calculate the values of derivative bits of two bits in the coded bit sequence, that have been determined by the error position determiner of the inner code as possible error positions of the same bit error, based on a logic XOR operation on the two bits in the coded bit sequence, wherein the value of the derivative bit of one of the two bits corresponds to a result of the logic XOR operation and the value of the derivative bit of the other of the two bits corresponds to a negated result of the logic XOR operation.

18. The apparatus as claimed in claim 1, wherein the error position determiner of the inner code is configured to calculate a value of a parity bit based on the bits in the coded bit sequence, wherein the overall error position determiner is configured to distinguish between a 1-bit error and an even multi-bit error based on the parity bit.

19. The apparatus as claimed in claim 1, wherein the overall error position determiner is configured to output an error signal for each bit in the coded bit sequence, wherein the error signal for a bit in the coded bit sequence indicates whether a 1-bit error has been identified for that bit in the coded bit sequence.

20. The apparatus as claimed in claim 19, wherein the error position determiner of the inner code is configured to produce the at least one possible error position in the form of a plurality of values of coded output bits, wherein the overall error position determiner is configured to determine an error signal for a bit in the coded bit sequence based on a logic XOR operation on the derivative bit for the bit in the coded bit sequence with the non-linear syndrome bit and based on a logic AND operation on the result of the logic XOR operation and at least one of the coded output bits from the error position determiner of the inner code.

21. The apparatus as claimed in claim 1, wherein the error position determiner of the inner code is configured to determine at least two possible incorrect bit positions for at least one 1-bit error in the coded bit sequence.

22. The apparatus as claimed in claim 1, wherein the error position determiner of the inner code is configured to determine a single possible error position for all 1-bit errors considered in the coded binary word.

23. The apparatus as claimed in claim 1, further comprising:
a 1-bit error correction unit configured to change a value of the bit at the determined or identified error position in the coded bit sequence in order to correct the 1-bit error.

24. The apparatus as claimed in claim 23, wherein the overall error position determiner is configured to output an error signal for each bit in the coded bit sequence, wherein the error signal for a bit in the coded bit sequence indicates whether there is a 1-bit error at that bit in the coded bit sequence, wherein the 1-bit error correction unit is configured to correct the 1-bit error on the basis of a logic XOR operation on the error signal for each bit in the coded bit sequence and the respective bit in the coded bit sequence.

25. The apparatus of claim 23, further comprising:
a decoding unit configured to decode the corrected, coded bit sequence in order to obtain a decoded bit sequence.

26. An apparatus for determination of a position of a 1-bit error in a bit sequence which is coded by means of an inner code and an outer non-linear code, comprising:
an apparatus configured to determine an error position of the inner code, and configured to determine at least one possible error position of a bit error in the coded bit sequence based on the inner code;
an apparatus configured to determine an error syndrome of the outer code, and configured to determine a value of a non-linear syndrome bit of the outer code based on a non-linear function of bits in the coded bit sequence;
an apparatus configured to calculate a derivative bit, and configured to determine a value of a derivative bit for at least one determined, possible error position of the bit error, based on derivation of the non-linear function based on the bit at the determined, possible error position in the coded bit sequence; and
an apparatus configured to determine an overall error position, and configured to determine an error position of the bit error based on the non-linear syndrome bit and at least one derivative bit when the apparatus for determination of an error position of the inner code determines more than one possible error position of the bit error, or wherein the apparatus configured to determine the overall error position is configured to identify the bit error as a 1-bit error based on the non-linear syndrome bit and a derivative bit of a determined, possible error position, and distinguish this from a multi-bit error, and thus identify the determined, possible error position as the error position of the 1-bit error, when the apparatus for determination of an error position of the inner code determines only one possible error position of the bit error in the coded bit sequence.

27. An apparatus for correction of a 1-bit error in a bit sequence comprising n bits $v=(u,w,\epsilon)$ where $u=u_1, \ldots, u_k$, w=$w_1,\ldots,w_t$ and k≤t, where $u_1,u_2,\ldots,u_k, w_1,\ldots,w_t \in \{0,1\}$, where n≥3, where (u,w) are elements of an inner code C, where the bit $\epsilon$ is determined by $$\epsilon = \phi(u_1,\ldots,u_k, w_1,\ldots,w_t)$$

and $\phi$ is a non-linear Boolean function, where a decoding function $D(u_1,\ldots,u_k, w_1,\ldots,w_t)$ and a non-empty subset $TM_w \subset \{w_1,\ldots,w_t\}$ comprising k elements exist, such that one and only one $w_{ji} \in TM_w$ exists for each $u_i \in \{u_1,\ldots,u_k\} = U$, such that (u,w)∈ C applies to all the code words of the inner code such that $$D(u_1,\ldots,u_{i-1},\overline{u}_1,u_{i+1},\ldots,u_k,w_1,\ldots,w_t)=D(u_1,\ldots,u_k,w_1,\ldots,w_{ji-1},\overline{w}_{ji},w_{ji+1},\ldots,w_t)=\text{Cod}(i,ji)$$

for all $u_i \in$ U, where Cod(i,j$_i$) is a coding of the bit positions of the bit $u_i$ and of the bit $w_{ji}$, where $$D(u_1,\ldots,u_k,w_1,\ldots,w_{r-1},\overline{w}_r,w_{r+1},\ldots,w_t)=\text{Cod}(r)$$

for $w_r \in \{w_1,\ldots,w_t\} \setminus TM_w$ and Cod(r) is a coding of the bit position of the bit $w_r$, where D(u,v)=Cod(0) for all code words (u,v) of the inner code C and Cod(0) is a coding that no error has been corrected, where $$\frac{\delta\phi}{\delta u_i} \neq \frac{\delta\phi}{\delta w_{ji}}$$

for $u_i \in$ U, and where k+t+1=n, comprising:
  a first partial circuit configured to implement the decoding function D, wherein the partial circuit has k+t binary inputs at which the values u,w=$u_1,\ldots u_k, w_1,\ldots,w_t$ are present and which outputs the value Cod(0) at its output when no error is present, outputs the value Cod(i,j$_i$) in the situation where there is a 1-bit error in the bit $u_i \in$ U or in the bit $w_{ji} \in TM_w$, and outputs the value Cod(r) in the situation where there is a 1-bit error in the bit $w_r \in \{w_1,\ldots,w_t\}\setminus TM_w$,
  a second partial circuit having k+1 binary inputs and one binary output, configured to implement the Boolean function $\phi$, at whose k+t binary inputs the binary values $u_1,\ldots,u_k, w_1,\ldots w_t$ are present and at whose output the value $\phi(u_1,\ldots,u_k, w_1,\ldots w_t)$ is output,
  a third partial circuit having two binary inputs and one binary output, configured to form the non-linear syndrome of the outer code Δ$\epsilon$=$\epsilon$+$\phi$(u1,...,uk,w1,...,wt), at whose first input the value $\epsilon$ is present and whose second input is connected to the output of the second partial circuit, and wherein the third partial circuit outputs at its output XOR-linked values which are present at its two inputs,
  a fourth partial circuit having k+t binary inputs and k+T binary outputs, configured to determine the Boolean derivatives $$\frac{\delta\phi}{\delta u_1},\ldots,\frac{\delta\phi}{\delta u_k}\ldots,\frac{\delta\phi}{\delta w_{i1}}\ldots,\frac{\delta\phi}{\delta w_{iT}}$$

wherein the values $u_1,\ldots,u_k, w_1,\ldots,w_t$ are present at the k+t inputs of the fourth partial circuit and T≤t,
  a fifth partial circuit configured to form correction values and having a first, a second and a third input and an output with a width of k+T bits, wherein the first input is connected to the output of the first partial circuit, the second input is connected to the output of the third partial circuit, and the third input, with a width of k+T bits, is connected to the output, which likewise has a width of k+T bits, of the fourth partial circuit, such that the output which has a width of k+T bits of the fifth circuit carries the k+T correction values $\Delta u_1,\ldots,\Delta u_k, \Delta w_{i1},\ldots,\Delta w_{iT}$, that are XOR-linked to the bits $u_1,\ldots,u_k,\ldots,w_{i1},\ldots,w_{iT}$.

28. The apparatus as claimed in claim 27, wherein the first partial circuit comprises a series circuit of a syndrome former of the inner code and of an associator.

29. The apparatus as claimed in claim 27, wherein the non-linear function $\phi(u_1,\ldots u_k, w_1,\ldots,w_t)$ is in the form $\phi(u_1,\ldots,u_k,w_1,\ldots,w_t)=u_1+\ldots,u_k+\lambda(u_1+w_{jl},\ldots,u_k+w_{jk}, w_{il},\ldots,w_{i(t-k)})$ and $\lambda$ is a non-linear function.

30. A method for determination of a position of a 1-bit error in a bit sequence which is coded by means of an inner code and an outer non-linear code, comprising:
  determining at least one possible error position of a bit error in the coded bit sequence based on the inner code;
  determining a value of a non-linear syndrome bit of the outer code based on a non-linear function of bits in the coded bit sequence;
  determining a value of a derivative bit for at least one determined, possible error position of the bit error based on derivation of the non-linear function based on the respective bit at the determined, possible error position in the coded bit sequence; and
  determining an error position of the bit error based on the non-linear syndrome bit and at least one derivative bit when more than one possible error position of the bit error has been determined, or identifying the bit error as a 1-bit error based on the non-linear syndrome bit and a derivative bit at a determined, possible error position, and distinguishing the 1-bit error from a multi-bit error and in this way identification of the determined, possible error position as the error position of the 1-bit error if only one possible error position of the bit error has been determined in the coded bit sequence.

* * * * *